United States Patent
Ishikura

(10) Patent No.: US 7,114,140 B2
(45) Date of Patent: Sep. 26, 2006

(54) SEMICONDUCTOR DEVICE, SEMICONDUCTOR DEVICE DESIGN METHOD, SEMICONDUCTOR DEVICE DESIGN METHOD RECORDING MEDIUM, AND SEMICONDUCTOR DEVICE DESIGN SUPPORT SYSTEM

(75) Inventor: Satoshi Ishikura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 176 days.

(21) Appl. No.: 10/600,737

(22) Filed: Jun. 20, 2003

(65) Prior Publication Data

US 2004/0128636 A1 Jul. 1, 2004

Related U.S. Application Data

(62) Division of application No. 10/278,496, filed on Oct. 23, 2002, now Pat. No. 6,611,950, which is a division of application No. 10/080,740, filed on Feb. 22, 2002, now Pat. No. 6,502,225, which is a division of application No. 09/274,659, filed on Mar. 23, 1999, now Pat. No. 6,421,816.

(30) Foreign Application Priority Data

Apr. 7, 1998 (JP) .................................. 10-94993

(51) Int. Cl.
*G06F 17/50* (2006.01)

(52) U.S. Cl. .......................................... 716/8; 716/12

(58) Field of Classification Search .................... 716/1, 716/2, 8–10, 12–14
See application file for complete search history.

(56) References Cited

U.S. PATENT DOCUMENTS

| 4,656,592 A | 4/1987 | Spaanenburg et al. |
| 5,500,542 A | 3/1996 | Iida et al. |

(Continued)

FOREIGN PATENT DOCUMENTS

JP 4/291944 A 10/1992

(Continued)

*Primary Examiner*—Stacy A. Whitmore
(74) *Attorney, Agent, or Firm*—Pearne & Gordon LLP

(57) ABSTRACT

Repeater cells each comprising a buffer or an inverter and an n+ diffusion layer-P well type protection diode or a p+ diffusion layer-N well type antenna protection diode connected to an input pin of the buffer or the inverter for preventing antenna damage or an antenna rule error from occurring are previously registered by registration means 511 as the cells to be registered in a cell library 505. Whether or not a wiring conductor conducting to a gate electrode becomes an antenna ratio exceeding an allowed antenna ratio in the semiconductor device is determined by determination means 514 and if the wiring conductor exceeds the allowable antenna ratio, one or more repeater cells are inserted into any point of the wiring conductor by selection means 515.

5 Claims, 16 Drawing Sheets

U.S. PATENT DOCUMENTS

| | | |
|---|---|---|
| 5,672,895 A | 9/1997 | Iida et al. |
| 5,736,772 A | 4/1998 | Ko et al. |
| 5,784,291 A | 7/1998 | Chen et al. |
| 5,828,119 A * | 10/1998 | Katsube .................. 257/491 |
| 5,854,752 A | 12/1998 | Agarwal |
| 5,955,764 A | 9/1999 | Katsube |
| 5,966,517 A * | 10/1999 | Cronin et al. ................. 716/1 |
| 6,002,155 A | 12/1999 | Tahara et al. |
| 6,113,648 A * | 9/2000 | Schuelein et al. ............ 716/17 |
| 6,199,192 B1 | 3/2001 | Marquez et al. |
| 6,209,123 B1 * | 3/2001 | Maziasz et al. ............... 716/14 |
| 6,292,927 B1 * | 9/2001 | Gopisetty et al. ............. 716/11 |
| 6,308,308 B1 * | 10/2001 | Cronin et al. .................. 716/8 |
| 6,502,225 B1 * | 12/2002 | Ishikura ........................ 716/7 |
| 2001/0044925 A1 | 11/2001 | Noguchi |

FOREIGN PATENT DOCUMENTS

| | | |
|---|---|---|
| JP | 6-61440 A | 3/1994 |
| JP | 6-204467 | 7/1994 |
| JP | 6-326248 | 11/1994 |
| JP | 7-235541 A | 9/1995 |
| JP | 8-306922 | 11/1996 |
| JP | 8-339392 | 12/1996 |

* cited by examiner

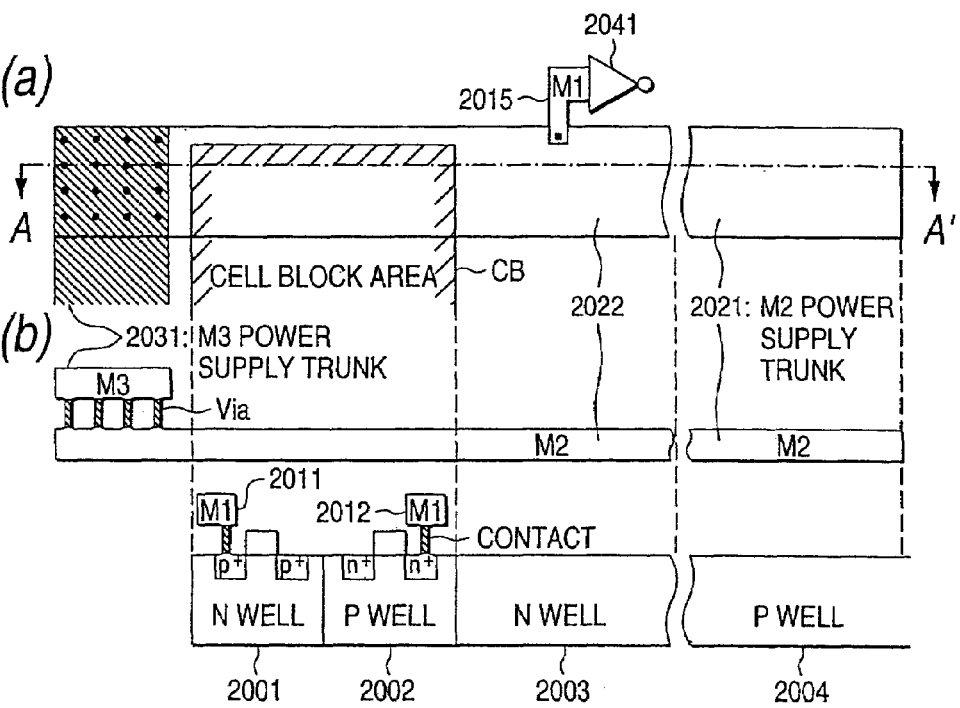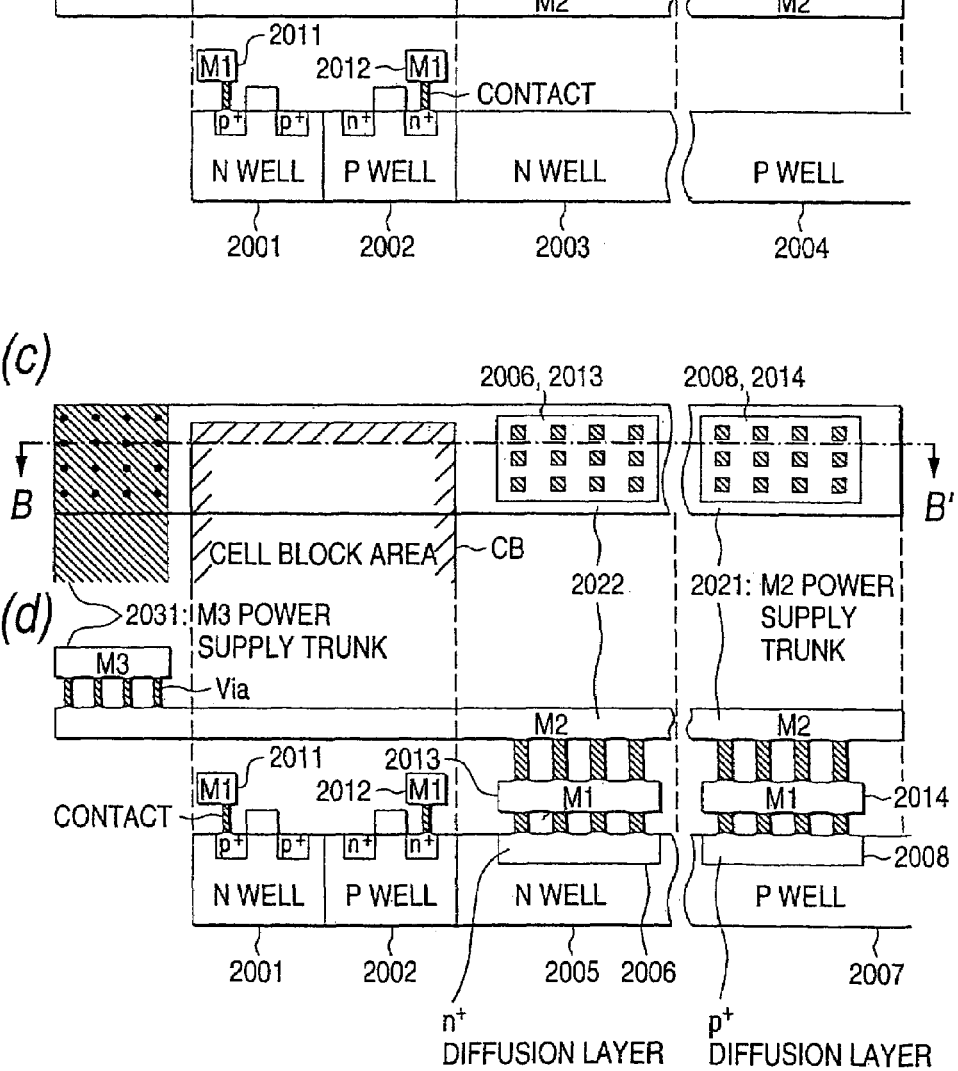

SEMICONDUCTOR DEVICE, SEMICONDUCTOR DEVICE DESIGN METHOD, SEMICONDUCTOR DEVICE DESIGN METHOD RECORDING MEDIUM, AND SEMICONDUCTOR DEVICE DESIGN SUPPORT SYSTEM

BACKGROUND OF THE INVENTION

This invention relates to a semiconductor device, a semiconductor device design method, a recording medium recording a program for executing the semiconductor device design method, and a semiconductor device design support system and in particular to a semiconductor device, a semiconductor device design method, a semiconductor device design method recording medium, and a semiconductor device design support system capable of preventing antenna damage caused by an antenna effect occurring in a plasma step at the metal wiring formation time in a semiconductor process.

In recent semiconductor process wiring steps, various plasma techniques have been used. The representative plasma techniques include dry etching at the wiring layer patterning, plasma TEOS film deposition of wiring layer insulating film in a multi-layered wiring step, and the like, for example, which will be hereinafter referred to as plasma steps.

For example, when plasma etching is executed, if a diffusion layer does not connect to metal wiring, plasma charges accumulate in the metal wiring and an electric current flows into the gate oxide film of the transistor to which the metal wiring connects. The current causes such trouble of destruction of the gate oxide film, change in the transistor characteristics because of film quality change of the gate oxide film, or degradation of the hot carrier life. Such phenomena are called "antenna effect" and trouble caused by the antenna effect will be hereinafter referred to as "antenna damage." This antenna damage is also caused by the antenna effect due to side walls of the of the metal wiring. In order to simplify the explanation, only areas of the metal wirings are taken into consideration.

Such antenna damage proceeds toward the worse when micro-miniaturization develops; the factors are as follows:

First, the gate oxide film itself of a transistor becomes thin and pressure resistance of the gate oxide film considerably lowers as compared with the conventional process. There is an estimation that as the film is furthermore thinned, the antenna damage is remedied because the tunnel current in the gate oxide film grows. However, it is said that antenna rule proceeds toward the worse until at least the gate oxide film thickness of about 5 nm generally used with CMOS according to 0.25-μm design rule.

Second, the minimum gate width reduces with micro-miniaturization of process, but the wiring length is not much shortened although micro-miniaturization of process develops, because the signal wiring length does not lessen if the chip size set considering yield, etc., is micro-miniaturized to about 10 mm square.

Third, although damage caused by plasma entering from a side wall of wiring at the over-etching in a dry etching step of wiring is the main factor of the antenna damage, if the wiring width is thinned, the wiring film thickness cannot be so thinned for the purposes of providing resistance to electro-migration of wiring and suppressing the resistance value.

Fourthly, as the wiring pattern becomes fine, the plasma density at the etching time also tends to rise.

Because of the factors as described above, if the antenna ratio is about several thousands in the recent fine process antenna damage such as destruction of a gate oxide film or characteristic degradation of a transistor has occurred during the manufacturing process in extremely general designed LSI although no problem arises even in the antenna ratio of about a hundred thousand in the conventional CMOS generation, etc., according to 0.8-μm design rule. The "antenna ratio" generally refers to the ratio between the area of a gate oxide film and the area of a conductive layer in which plasma charges occurring at the plasma etching time are accumulated.

Against the backdrop, it becomes necessary to take countermeasures against electrostatic destruction in the chip considering a wafer diffusion step apart from ESD protection on packaging and handling required for conventional I/O pins.

The above-described "antenna ratio of about several thousands" means that design considering the antenna damage is required not only for a long pattern such as a power supply, but also in general signal wiring in LSI. This is shown using general values of the current process.

For example, assuming that the area of a gate oxide film portion, namely, gate length X gate width is 0.25 μm×0.6 μm and that the wiring width is 0.4 μm and applying the antenna rule of "assuming wiring with antenna ratio=3000 or more to be an error," the allowed wiring length becomes 1125 μm. However, in the antenna ratio calculation, the conductive layer area in which plasma charges are accumulated is calculated as the area of wiring only.

Therefore, to use such metal wiring running on one side of the chip of LSI having a chip size of 10 mm square as described above, the antenna rule is applied and the metal wiring becomes antenna wiring that can cause antenna damage. However, this does not mean that whenever such an antenna ratio is applied, antenna damage occurs. If a diffusion layer connects to the target wiring in a plasma step, plasma charges escape via the diffusion layer, thus antenna damage does not occur in the gate oxide film; this fact also need to be considered. This means that if an aluminum pattern with the gate oxide film connecting to long aluminum wiring, not connected to the diffusion layer exists, an antenna rule error occurs.

Next, how antenna damage, namely, an antenna rule error occurs in the actual LSI design and specific examples of conventional countermeasures to be taken when the antenna damage, namely, an antenna rule error occurs will be discussed.

First, specific examples of comparatively easy countermeasures against antenna image are given. FIG. 16 is a schematic diagram to show a state in which an unused input pin in a functional block is connected to a power supply trunk and potential is fixed. In the figure, in a functional block 2101 such as RAM or ROM, a second metal input pin 2102 unused is connected via first metal wiring 2103 to a second metal power supply trunk 104 and potential is fixed. The second metal power supply trunk 104 is connected to a third metal power supply trunk 105. When the second metal is etched in a wiring step of such configured LSI, the third metal power supply trunk 105 does not yet exist. Thus, the second metal power supply trunk 104 becomes giant antenna wiring in a floating state not connected to a diffusion layer with respect to a gate oxide film connected to the second metal input pin 2102 unused.

Available as the countermeasures to be taken when such an antenna error occurs are a method of adding an antenna protection diode as shown in FIG. 17A or 17B to the second metal power supply trunk 104 of the antenna wiring or the first metal wiring 2103, a method of changing the first metal wiring 2103 to third metal wiring, and the like.

If an antenna protection diode is added according to the first countermeasure, plasma charges escape through a diffusion layer of the protection diode as described above, so that occurrence of antenna damage is eliminated. FIG. 17A is a schematic representation to show the structure of an n+ diffusion layer-P well type antenna protection diode 2201 consisting of an n+ diffusion layer 2202 and a P well 2203 fixed to power supply potential VSS and FIG. 17B is a schematic representation to show the structure of a p+ diffusion layer-N well type antenna protection diode 2211 consisting of a p+ diffusion layer 2212 and an N well 2213 fixed to power supply potential VDD.

If the first metal wiring 2103 is changed to third metal wiring according to the second countermeasure, the functional block 2101 and the second metal power supply trunk 104 are separated at the etching time of the second metal forming the second metal power supply trunk 104, thus antenna damage cannot occur.

If an unused input pin is fixed in a normal block formed of a standard macro cell, usually it is fixed to a power supply in the macro cell or a power supply trunk to which the power supply in the macro cell is connected. Since the power supply in the standard macro cell is provided with a substrate contact almost beyond doubt, a path to a well via a diffusion layer exists. Thus, in such a block formed of a standard cell, antenna damage in an unused input pin with potential fixed can little occur.

Next, a specific example of signal wiring harder to counter antenna damage will be discussed with reference to FIGS. 18A to 18C. FIG. 18A is a schematic diagram to describe a layout of signal wiring from one inverter 2301 to another inverter 2302.

In an automatic placement wiring tool, normally longitudinal and lateral wiring layers assigned are used for wiring without considering an antenna rule as described above. Assume that one signal wiring is laid out as first metal wiring 2312 which is very long exists, as shown in FIG. 18A. That is, it is a wiring layout using first metal wiring 2311, 2312 and second metal wiring 2321.

In the layout in FIG. 18A, it seems that antenna damage does not occur because a drain diffusion layer of a transistor in the inverter 2301 is connected to the signal wiring. However, it should be noted that when the first metal wiring 2312 is etched, the second metal wiring 2321 does not exist. That is, the drain diffusion layer of the inverter 2301 is not connected to the first metal wiring 2312, which is long and becomes wiring that can cause antenna damage for a transistor gate oxide film of the inverter 2302.

Layout design considering the antenna rule is not yet general and effective countermeasures against antenna damage are not established as things stand now. Used as the countermeasures against antenna damage at present are a method of adding an antenna protection diode to first metal wiring 2312*b* which is long and can cause antenna damage as shown in FIG. 18B, a method of providing diffusion layer wiring 2503 at an intermediate point of the first metal wiring 2312 in FIG. 18A, as shown in FIG. 19A, a method of specifying use of upper layer wiring 2541 such as second or third metal as the first metal wiring 2312 in FIG. 18A and again performing automatic wiring processing, as shown in FIG. 19B, and the like, for example.

If an antenna protection diode is added according to the first countermeasure, plasma charges escape through a diffusion layer of the protection diode as described above, so that occurrence of antenna damage is eliminated. The antenna protection diode may be an n+ diffusion layer-P well type antenna protection diode 2303 as shown in FIG. 18B or a p+ diffusion layer-N well type antenna protection diode 2304 as shown in FIG. 18C; it may be designed to apply a reverse bias to a signal line to which the protection diode is connected so that no problem occurs on the operation if the potential level of the signal line changes to high or low. To be precise, if the antenna protection diode is added, the load of the signal line becomes heavy because diffusion capacitance is added. However, if diodes are embedded on mask operation all in wiring that can cause an antenna error, a wiring load problem arises; a load capacitance problem hardly occurs if a contact of the minimum size is added or so.

If a wiring route passing through the diffusion layer wiring 2503 is provided at an intermediate point of the first metal wiring 2312 in FIG. 18A according to the second countermeasure, plasma charges escape through the diffusion layer, so that occurrence of antenna damage is eliminated. FIG. 19A shows an example of using an n+ diffusion layer formed on a P well fixed to power supply potential VSS.

Further, if use of the third metal wiring 2541 as the first metal wiring 2312 is specified and automatic wiring processing is again performed, as shown in FIG. 19B, according to the third countermeasure, at the etching time of the second metal forming the second metal wiring 2321, the second metal wiring 2321 and the gate oxide film of the inverter 2302 are separated and the diffusion layer of the inverter 2301 is connected to the second metal wiring 2321, thus antenna damage cannot occur.

However, the above-described conventional countermeasures taken when antenna damage or an antenna rule error occurs involve the following problems:

First, throughout all the countermeasures, an additional correction to an antenna error is required and when an attempt is made to use a CAD tool for automation, a clear and effective procedure does not exist. That is, an antenna rule error is frequently found at a one-chip wiring layout stage close to the end of design and the current automatic placement wiring tool of CAD does not provide a function for avoiding an antenna rule error. Therefore, with the current state of the art, the designer manually takes such measures of adding an antenna protection diode to a device for which an error is found at the stage where a mask order is about to be given. Such a relapse in the design stage and occurrence of manual work become the largest problem in design automation.

The second countermeasure (see FIG. 19A) involves a performance problem. This means that to provide a wiring route passing through the diffusion layer at an intermediate point of metal wiring, a large resistance value is added as compared with the metal wiring owing to the diffusion layer, worsening the circuit operation speed. If the process is a silicide process, such worsening of the circuit operation speed is a little alleviated.

A common problem to the first and second countermeasures is to place limitations on a design style. In recent years, a technique of executing steps in parallel with layout design as much as possible has been adopted for shortening the time from LSI design to manufacturing. For example, at completion of a chip at the block level, if the blocks are placed and a mask order is given from the ground and diffusion is started on one hand and layout design is furthermore advanced and an antenna rule error is found in the later layout design using aluminum wiring on an upper layer on the other hand, the error cannot be handled by changing the design of the lower layer.

In such a case, the error has to be avoided by changing wiring; a limitation is placed so as to use upper layer metal in place of the metal wiring where the antenna rule error occurs, for example. In this case, the wiring is connected to the diffusion layer at the wiring etching stage and the antenna rule error is solved. However, if the error occurrence frequency increases, wiring corrections as countermeasures against the antenna rule errors are made to the device with wiring well laid out, largely changing the congestion degree of the upper layer aluminum wiring and the wiring pattern. Then, when the wiring is again executed, it cannot be fitted as the same area as before the antenna rule error corrections are made is held, or the wiring congestion degree and the wiring length are changed, thus new trouble of occurrence of a timing error on logical circuit design not previously occurring is caused.

In the recent LSI design, signals whose wiring delay is to be suppressed have been wired at gentle pitches with thick metal film wiring of an upper layer as much as possible; an increase in the congestion degree of the upper layer wiring is undesirable for speed performance.

SUMMARY OF THE INVENTION

It is therefore an object of the invention to provide a semiconductor device, a semiconductor device design method, a semiconductor device design method recording medium, and a semiconductor device design support system capable of preventing antenna damage caused by an antenna effect occurring in a plasma step at the metal wiring formation time in a semiconductor process.

It is another object of the invention to provide a semiconductor device, a semiconductor device design method, a semiconductor device design method recording medium, and a semiconductor device design support system that can handle antenna damage or an antenna rule error at high speed and precisely by automatic processing of a CAD tool, etc., if the antenna damage or antenna rule error occurs.

It is still another object of the invention to provide a semiconductor device, a semiconductor device design method, a semiconductor device design method recording medium, and a semiconductor device design support system that can take countermeasures against antenna damage or an antenna rule error with upper layer metal wiring as much as possible by automatic processing of a CAD tool, etc., if the antenna damage or antenna rule error occurs, and resultantly can handle the antenna damage or antenna rule error with small-scale change so that the operation timing on logical circuit design does not largely change before and after the countermeasures are taken.

According to a first aspect of the invention, there are provided a semiconductor device, a semiconductor device design method, a semiconductor device design method recording medium, and a semiconductor device design support system, wherein as cells, etc., to be registered in a cell library, etc., registration step (registration means) previously registers a first cell, etc., having a first conduction type diode comprising a first conduction type diffusion layer connected to an input pin of the cell, etc., and a second conduction type well connected to a second power supply or a second conduction type diode comprising a second conduction type diffusion layer connected to the input pin and a first conduction type well connected to a first power supply and a second cell, etc., not containing the first or second conduction type diode and comprising the same logic as and the same drive capability as the first cell, etc., determination step (determination means) determines whether or not a wiring conductor conducting to the input pin and a gate electrode becomes an antenna ratio exceeding an allowed antenna ratio in the semiconductor device when the antenna ratio is a ratio between the area of the wiring conductor conducting to the gate electrode and the area of the gate electrode, and selection step (selection means) selectively uses the first cell, etc., if the input pin conducts to the gate electrode exceeding the antenna ratio.

That is, after execution of automatic placement and wiring, replacement of cells, etc., occurs. However, a protection diode is added only to a node requiring a countermeasure against occurrence of possible antenna damage or a possible antenna rule error, thus an increase in the semiconductor device area is suppressed and extra protection diodes are not formed; an increase in the parasitic load capacitance of wiring can be suppressed accordingly and as a result, the signal propagation delay time can be shortened and the power consumption of the semiconductor device can be decreased.

According to a second aspect of the invention, there are provided a semiconductor device, a semiconductor device design method, a semiconductor device design method recording medium, and a semiconductor device design support system, wherein as cells, etc., to be registered in a cell library, etc., registration step (registration means) registers repeater cells each having a buffer or an inverter and a first conduction type diode comprising a first conduction type diffusion layer connected to an input pin of the buffer or the inverter and a second conduction type well connected to a second power supply or a second conduction type diode comprising a second conduction type diffusion layer connected to the input pin and a first conduction type well connected to a first power supply, determination step (determination means) determines whether or not a wiring conductor conducting to a gate electrode in the semiconductor device exceeds an allowed antenna ratio in the semiconductor device when the antenna ratio is a ratio between the area of the wiring conductor conducting to the gate electrode and the area of the gate electrode, and insertion step (insertion means) inserts one or more repeater cells into any point of the wiring conductor if the wiring conductor exceeds the allowed antenna ratio. Preferably, the repeater cell comprises two buffers or inverters connected in series and the output buffer or inverter has a larger drive capability than the input buffer or inverter.

Thus, a long wiring conductor where it is feared that antenna damage or an antenna rule error may occur is divided by inserting one or more repeater cells, whereby the signal propagation delay of the wiring is suppressed (first advantage). As the length of the wiring is shortened, antenna damage can be suppressed (second advantage). Further, a protection diode is added to an input pin of a repeater cell, whereby an antenna rule error does not occur for the divided metal wiring connected to the repeater cell (third advantage).

According to a third aspect of the invention, there are provided a semiconductor device, a semiconductor device design method, a semiconductor device design method recording medium, and a semiconductor device design support system, wherein a substrate contact containing a first conduction type diffusion layer and a first conduction type well or a substrate contact containing a second conduction type diffusion layer and a second conduction type well is produced so that an unused input pin of the cells, etc., is brought into conduction to a first or second power supply via the substrate contact, whereby a path flowing into the diffusion layer is provided even in the configuration to which a protection diode is not added. Thus, to connect an unused pin to a power supply trunk and fix the potential of the unused pin, an antenna rule error is not caused. Since it leads to stabilization of the well potential, noise resistance, latch-up resistance, and the like of the semiconductor device are also improved.

According to a fourth aspect of the invention, there are provided a semiconductor device, a semiconductor device design method, a semiconductor device design method recording medium, and a semiconductor device design support system, wherein each wiring conductor conducting to a gate electrode in each of the wiring layers, when a ratio between the area of the wiring conductor conducting to the gate electrode and the area of the gate electrode is assumed to be an antenna ratio, is limited to an area or a wiring length such that the wiring conductor becomes an antenna ratio of less than a half an antenna ratio allowed essentially in the semiconductor device and is divided into at least three parts for wiring. Thus, the length of wiring continuously running in the same wiring layer is limited to less than a half the original antenna rule value and is divided into at least three parts, whereby wiring forcibly is changed, namely, long wiring can be divided, whereby the antenna ratio of wiring can be suppressed and resultantly, the number of antenna error occurrences can be decreased.

According to a fifth aspect of the invention, there are provided a semiconductor device design method, a semiconductor device design method recording medium, and a semiconductor device design support system, wherein registration step (registration means) defines a position where a first conduction type diffusion layer and a contact can or cannot be placed on a second conduction type well or a position where a second conduction type diffusion layer and a contact can or cannot be placed on a first conduction type well as shape data of each of the cells, etc., to be registered in a cell library, etc., determination step (determination means) determines whether or not a wiring conductor conducting to a gate electrode in the semiconductor device exceeds an allowed antenna ratio in the semiconductor device when the antenna ratio is a ratio between the area of the wiring conductor conducting to the gate electrode and the area of the gate electrode, and insertion step (insertion means) selectively inserts a first conduction type diode or a second conduction type diode if the wiring conductor exceeds the allowed antenna ratio.

Thus, to automatically insert a protection diode, it is not necessary to determine the placement position of the protection diode while seeing various related layers of a diffusion area, polysilicon, etc., in a CAD (computer aided design) system, so that the processing amount in the CAD system may be very light.

According to a sixth aspect of the invention, there are provided a semiconductor device, a semiconductor device design method, a semiconductor device design method recording medium, and a semiconductor device design support system, wherein determination step (determination means) determines whether or not a wiring conductor conducting to a gate electrode in the semiconductor device and having long wiring in an ith wiring layer exceeds an allowed antenna ratio in the semiconductor device when the antenna ratio is a ratio between the area of the wiring conductor conducting to the gate electrode and the area of the gate electrode; and if the wiring conductor exceeds the allowed antenna ratio, insertion step (insertion means) cuts the long wiring in the ith wiring layer in the proximity of the gate electrode and forms the wiring conductor by connecting a short wiring conductor in the ith wiring layer from the gate electrode to the cut point and a long wiring conductor in the ith wiring layer ahead the cut point by a bridge wiring conductor of a length as long as at least two grids in a jth wiring layer of an upper layer above the ith wiring layer ($i<j\leq n$).

Thus, effective countermeasures against an antenna rule error can be taken. For example, the long wiring in the ith wiring layer causing an antenna rule error before a bridge wiring conductor is placed in the (i+1)th wiring layer is disconnected from the gate electrode at the etching time of wiring of the ith wiring layer by connecting via the bridge wiring conductor in the (i+1)th wiring layer and therefore complete countermeasures against an antenna rule error can be taken. It is feared that bridge wiring may be unable to be used for the top layer because a wiring layer does not exist on the top layer. However, when top layer wiring is etched, a desired circuit configuration is almost accomplished, thus a buffer diffusion layer for driving signal wiring is connected to all long wiring conductors and there is no antenna damage in the wiring formation step of the top layer.

That is, in the invention, if two empty grids of wiring exist in the jth wiring layer of an upper layer (or if two empty grids can be generated), antenna damage or an antenna rule error can be prevented from occurring and the point where bridge wiring is placed is determined by finding an area from the side near the gate electrode of long wiring, so that occurrence of antenna damage caused by the remaining wiring leading to the gate electrode side after the long wiring is cut by the bridge wiring can also be suppressed. Further, basically (unless empty grids are forcibly provided), empty grids of wiring in the jth wiring layer are used, thus a large move of any other wiring little occurs, the whole layout little changes before and after the bridge wiring countermeasure against an antenna rule error is taken, and signal timing change on a large logical circuit does not occur either. Since only an upper wiring layer is used, if an mask order is started in order from the bottom in parallel with layout design to shorten the design period, a wiring layout of upper wiring layers can be handled easily to deal with the antenna rule.

According to a seventh aspect of the invention, there are provided a semiconductor device design method, a semiconductor device design method recording medium, and a semiconductor device design support system, wherein in the insertion step (insertion means), finding step (search means) finds an area of two or more contiguous empty grids in the jth wiring layer overlapping the long wiring in the ith wiring layer from the side near the gate electrode relative to the long wiring in the ith wiring layer and determines insertion of the bridge wiring conductor into the found area.

Thus, the bridge wiring countermeasure against an antenna rule error provided by the insertion step (insertion means) can be efficiently built in the design support system for use. As the bridge wiring is installed, change is only made to a wiring layout of a structure wherein only the two-grid wiring of the long wiring originally existing in the ith wiring layer is lifted up to the jth wiring layer above the ith wiring layer, thus the total wiring length of the signal wiring, the parasitic additional capacitance existing between the signal wiring and any other wiring, and the like little change. Further, the bridge wiring requires at least two via electrodes to make connection between the ith and jth wiring layers and two-via electrode resistance is added to the signal wiring, but can be almost ignored. Thus, the signal timing on the logical circuit, etc., little changes before and after the countermeasures against an antenna rule error are taken. This eliminates such former inefficient design procedure repeating corrections between the normal layout design and design of the countermeasures against an antenna rule error.

According to an eighth aspect of the invention, there are provided a semiconductor device design method, a semiconductor device design method recording medium, and a semiconductor device design support system, wherein if the finding step (search means) cannot determine an insertion area, the insertion step (insertion means) finds a first area of an empty grid in the jth wiring layer overlapping the long wiring in the ith wiring layer from the side near the gate electrode relative to the long wiring in the ith wiring layer, sets a position of the ith wiring layer overlapping the first area to a cut point of the long wiring, moves a long wiring conductor ahead the cut point in the ith wiring layer to another empty area containing a second area in the jth wiring layer overlapping the cut point after the move, and adopts a wiring conductor spread over the first and second areas as the bridge wiring conductor in the jth wiring layer. Thus, even if two or more contiguous empty grids of wiring do not exist in the jth wiring layer of an upper layer, if a first area of an empty grid in the jth wiring layer, an area to which the wiring conductor ahead the cut point in the ith wiring layer can be moved, and a second area of an empty grid in the jth wiring layer can be found, antenna damage or an antenna rule error can be reliably prevented from occurring.

According to a ninth aspect of the invention, there are provided a semiconductor device design method, a semiconductor device design method recording medium, and a semiconductor device design support system, wherein if the finding step (search means) cannot determine an insertion area, the insertion step (insertion means) finds a first area of an empty grid in the jth wiring layer overlapping the long wiring in the ith wiring layer from the side near the gate electrode relative to the long wiring in the ith wiring layer, inserts the bridge wiring conductor in the jth wiring layer to a second area of a length as long as at least two grids from the first area, and again wires wiring conductor in the ith wiring layer overlapping the second area. Thus, even if two or more contiguous empty grids of wiring do not exist in the jth wiring layer of an upper layer, if a first area of an empty grid in the jth wiring layer can be found, antenna damage or an antenna rule error can be reliably prevented from occurring. Since the wiring layout is corrected as the wiring is shifted as a whole, the layout of the wiring conductors is not largely changed and the operation timing, etc., little changes before and after the countermeasure against an antenna rule error is taken.

According to a tenth aspect of the invention, there are provided a semiconductor device design method, a semiconductor device design method recording medium, and a semiconductor device design support system, wherein if the finding step (search means) cannot determine an insertion area, the insertion step (insertion means) finds a first area and a second area which are discontiguous and contain each an empty grid in the jth wiring layer overlapping the long wiring in the ith wiring layer from the side near the gate electrode relative to the long wiring in the ith wiring layer and inserts a bridge wiring conductor in a kth wiring layer above the jth wiring layer (j<k≦n) between the first and second areas. Thus, even if two or more contiguous empty grids of wiring do not exist in the jth wiring layer of an upper layer, if two empty areas can be found, the kth wiring layer can be used to install bridge wiring.

BRIEF DESCRIPTION OF THE DRAWINGS

FIG. 11A is a pattern diagram before countermeasure is taken, FIG. 11B is a pattern diagram after countermeasure is taken, FIG. 11C is a schematic representation of bridge wiring with equal direction margin, and FIG. 11D is a schematic representation of bridge wiring with different direction margin;

FIG. 12A is a pattern diagram before countermeasure is taken and FIG. 12B is a pattern diagram after countermeasure is taken;

FIGS. 15 is a schematic diagram to conceptually describe a layout of a semiconductor device of a third embodiment of the invention;

DETAILED DESCRIPTION OF THE PREFERRED EMBODIMENTS

Embodiments of a semiconductor device, a semiconductor device design method, a recording medium, and a semiconductor device design support system of the invention will be discussed in order of first embodiment to sixth embodiment in detail with reference to the accompanying drawings. Although the semiconductor device, the semiconductor device design method, and the semiconductor device design support system according to the invention will be discussed in detail in the description of each embodiment, the recording medium according to the invention is a recording medium recording a program for executing the semiconductor device design method and therefore the description of the recording medium is contained in that of the semiconductor device design method.

The semiconductor device, the semiconductor device design method, the recording medium, recording medium, and the semiconductor device design support system of the invention are fitted to a gate array method, a master slice method, or a standard cell method in LSI layout design. The gate array or master slice method refers to a method of previously preparing a diffused wafer or a master slice comprising a regular array of sets of elements called basic cells and determining a wiring pattern according to a given logical circuit, thereby providing desired LSI. In the method, macro cells of logical gates and logical functional blocks provided by combining the basic cells and adding a wiring pattern are registered in a library and are placed and wired for providing desired LSI. The standard cell method refers to a method of previously registering cells (functional blocks) in a library, basically arranging the cells almost equal in height in a row, and determining a wiring pattern according to a given logical circuit, thereby providing desired LSI. The invention can also be applied to a general cell method and a building block method of arranging a large number of blocks of any size and the scope of the invention is not limited to the methods listed here. Although embodiments of the semiconductor device, the semiconductor device design method, the recording medium, and the semiconductor device design support system of the invention are given for describing the invention specifically, the invention is not limited to the embodiments and various modifications can be made without departing from the spirit and scope of the semiconductor device, the semiconductor device design method, the recording medium, and the semiconductor device design support system according to the invention.

First Embodiment

Figure 1A:
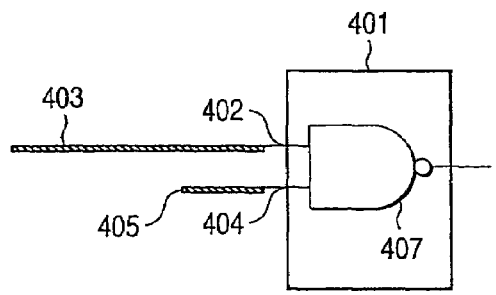
FIGS. 1A and 1B are schematic diagrams to conceptually describe a layout of a semiconductor device of a first embodiment of the invention.
Figure 1B:
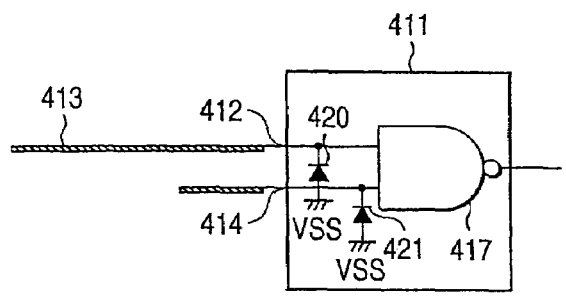
Figure 2:
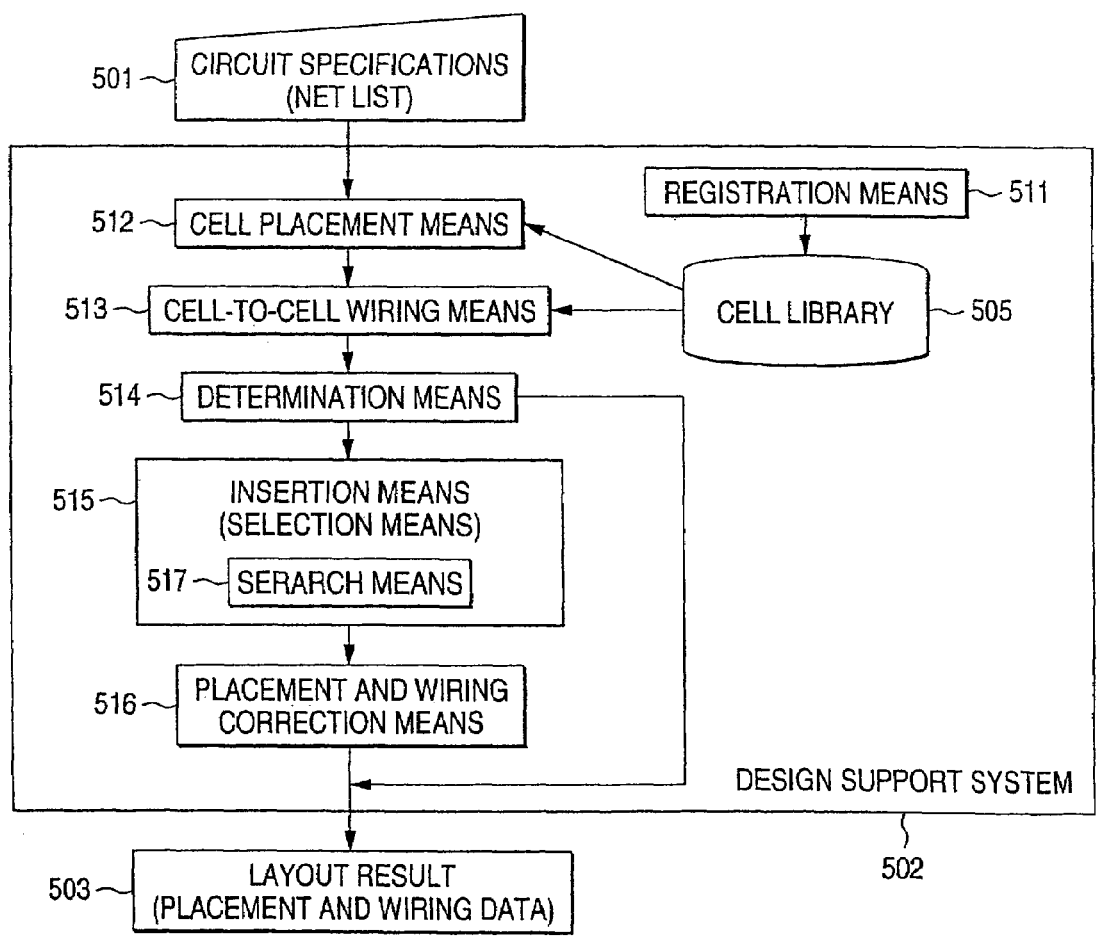
FIG. 2 is a block diagram of a semiconductor device design support-system of the first embodiment of the invention.
Figure 3:
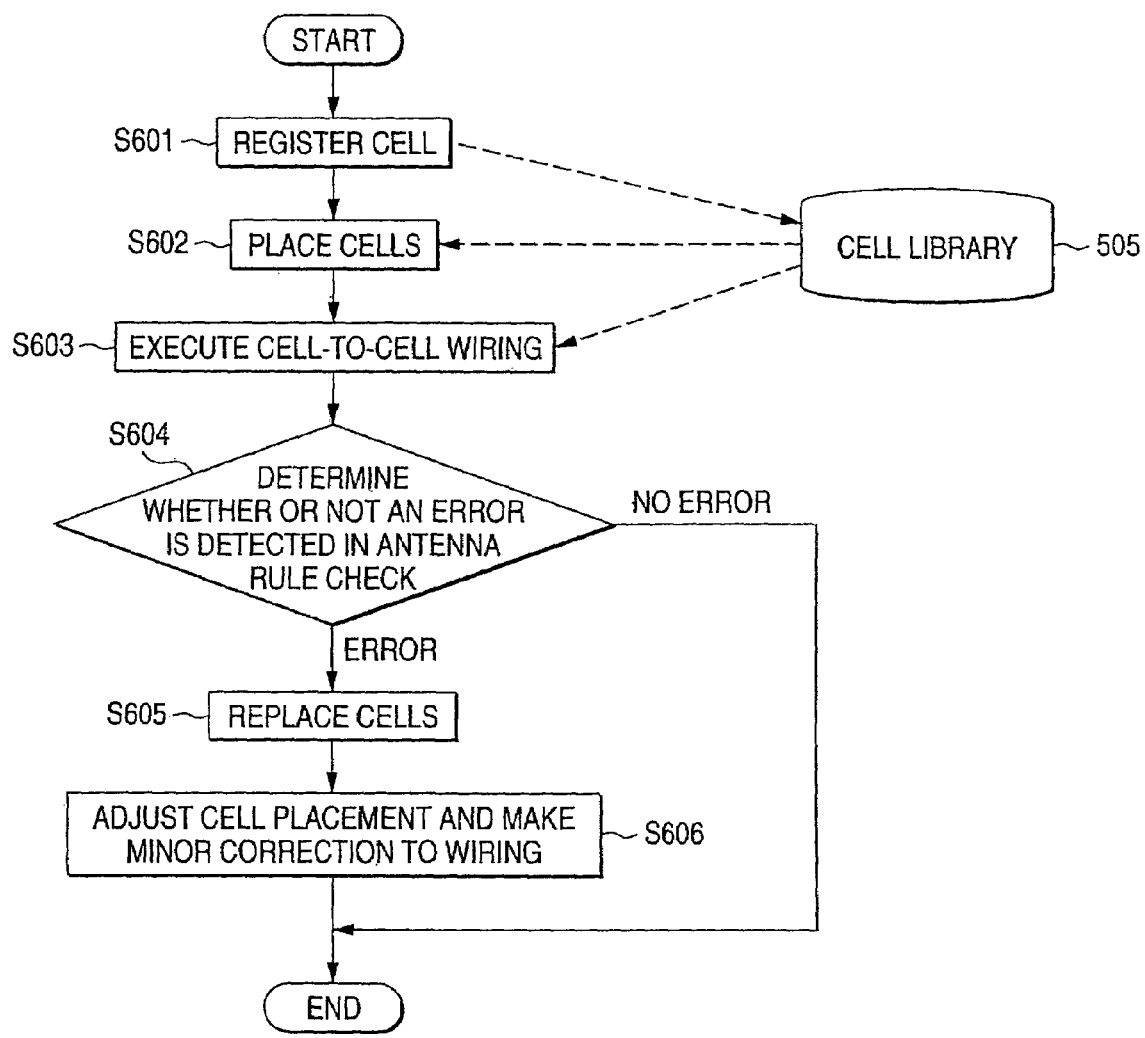
FIG. 3 is a flowchart to describe a semiconductor device design method of the first embodiment of the invention.

Next, a semiconductor device, a semiconductor device design support system, and a semiconductor device design method according to a first embodiment will be discussed with reference to FIGS. 1 to 3. FIGS. 1A and 2B are schematic diagrams to conceptually describe a layout of the semiconductor device of the first embodiment. FIG. 2 is a block diagram of the semiconductor device design support system of the first embodiment. FIG. 3 is a flowchart to describe the semiconductor device design method of the first embodiment.

Figure 16:
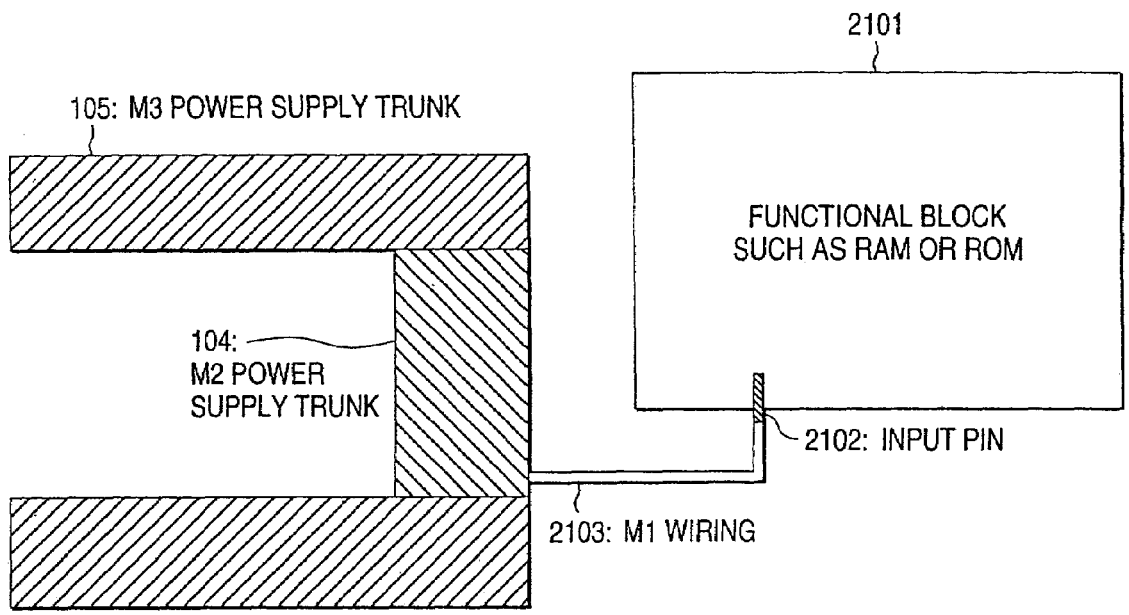
FIG. 16 is a schematic diagram to show a state in which an unused input pin in a functional block is connected to a power supply trunk and potential is fixed in related art.
Figure 17A:
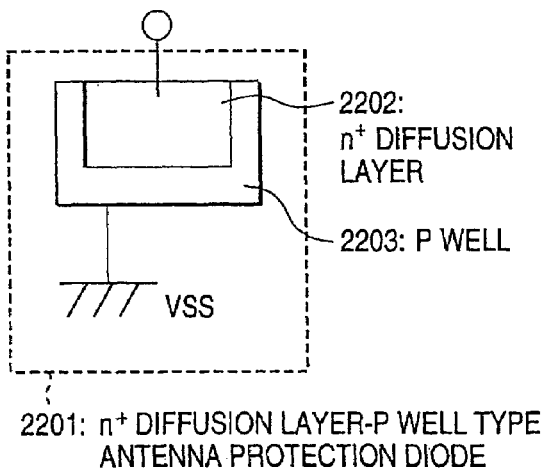
FIG. 17A is a schematic diagram to describe a method of adding an antenna protection diode and FIG. 17B is a schematic diagram to describe a method of changing first metal wiring to third metal wiring.

The embodiment is characterized by the fact that first-kind cells each comprising an n+ diffusion layer-P well type protection diode (or a p+ diffusion layer-N well type antenna protection diode; for the structures of the diodes, see FIGS. 17A and 16B) connected to an input pin for preventing antenna damage or an antenna rule error from occurring and second-kind cells each not containing the protection diode and having the same logic as and the same drive capability as the first-kind cell are previously registered by registration means 511 or at a registration step S601 as the cells to be registered in a cell library 505 and that whether or not a wiring conductor conducting to an input pin and a gate electrode becomes an antenna ratio exceeding an allowed antenna ratio in the semiconductor device is determined by determination means 514 or at a determination step S604 and if the input pin conducts to the wiring conductor exceeding the allowable antenna ratio, the first-kind cell is selectively used by selection means 515 or at a selection step S605. The antenna ratio is the ratio between the area of the wiring conductor conducting to the gate electrode and the area of the gate electrode. For example, the antenna ratio is set to a value of about 5000 in a 0.35-μm design rule or a value of about 3500 in a 0.25-μm design rule.

FIG. 1A is a schematic diagram to illustrate a wiring layout surrounding a second-kind cell 401 comprising a NAND gate circuit 407, wherein metal wiring 403 and metal wiring 405 are connected to input pins 402 and 404. In the embodiment, for example, if the metal wiring 403 is determined antenna wiring exceeding the allowable antenna ratio and resulting in an antenna rule error, the second-kind cell 401 is replaced with a first-kind cell 411, as shown in FIG. 1B. That is, in FIG. 1B, the first-kind cell 411 comprises input pins 412 and 414 provided with n+ diffusion layer-P well type protection diodes 420 and 421, respectively, for preventing antenna damage or an antenna rule error from occurring. Thus, if metal wiring 413 is antenna wiring, when it is etched, plasma charges can escape through a diffusion layer of the protection diode 420, and a transistor gate electrode of the NAND gate circuit 417 becomes free of antenna damage.

Next, in FIG. 2, semiconductor device design support system 502 of the embodiment comprises registration means 511 for previously registering cells in the cell library 505, cell placement means 512 for combining and placing cells while referencing the cell library 505 according to given logical circuit specifications 501, cell-to-cell wiring means 513 for determining wiring between the placed cells while referencing the cell library 505 according to the given logical circuit specifications 501, determination means 514 for checking a wiring conductor for antenna rule, selection means 515 for replacing a cell connected to the wiring conductor where an antenna rule error occurs with a first-kind cell comprising a protection diode connected to an input pin, and placement and wiring correction means 516 for placing the entire chip and make a minor correction to wiring, and outputs layout result (placement and wiring data) 503.

In the embodiment, a layout of the semiconductor device is designed as follows: As shown in the flowchart of FIG. 3, first at step S601, a cell is registered in the cell library 505 by the registration means 511. The registered cell is a first-kind cell comprising an n+ diffusion layer-P well type protection diode (or a p+ diffusion layer-N well type antenna protection diode) connected to an input pin for preventing antenna damage or an antenna rule error from occurring or a second-kind cell not containing the protection diode and having the same logic as and the same drive capability as the first-kind cell. At step S602, second-kind cells are combined and placed by the cell placement means 512 while referencing the cell library 505 according to given logical circuit specifications 501. At step S603, wiring between the placed second-kind cells is determined by the cell-to-cell wiring means 513 while referencing the cell library 505 according to the given logical circuit specifications 501.

Next, at step S604, a wiring conductor is checked for antenna rule by the determination means 514. That is, whether or not the wiring conductor conducting to an input pin and a gate electrode satisfies the allowable antenna ratio is determined. If the input pin conducts with the wiring conductor exceeding the allowable antenna ratio (an antenna rule error occurs), control goes to step S605 at which the second-kind cell comprising the input pin is replaced with a first-kind cell by the selection means 515. Then, at step S606, the placement and wiring correction means 516 adjusts placement of other cells affected by replacing the second-kind cell with the first-kind cell and makes a minor correction to the cell-to-cell wiring after the placement is adjusted. If no antenna rule error occurs at step S604, then the layout design is terminated.

The description assumes that the first-kind and second-kind cells have the same logic and the same drive capability. However, if they have the same shape, namely, the same cell area and the same pin placement, an antenna rule error can be handled simply by replacing the cells and step S606 in the flowchart of FIG. 3 (adjustment of cell placement and minor correction of wiring) becomes unnecessary; the antenna rule error can be handled more easily. On the other hand, if importance is attached to the chip area rather than a minute increase in the design time, the second-kind cells 401 not comprising protection diodes may be packed as small as possible in design.

As described above, in the embodiment, after execution of automatic placement and wiring, replacement of cells occurs as compared with the first embodiment. However, a protection diode is added only to a node requiring a countermeasure against occurrence of possible antenna damage or a possible antenna rule error, thus an increase in the semiconductor device area is suppressed and extra protection diodes are not formed; an increase in the parasitic load capacitance of wiring (input capacitance of input pin) can be suppressed accordingly and as a result, the signal propagation delay time can be shortened and the power consumption of the semiconductor device can be decreased.

Third Embodiment

Next, a semiconductor device, a semiconductor device design support system, and a semiconductor device design method according to a second embodiment will be discussed with reference to FIGS. 2, 4A to 4E and 5. FIGS. 4A to 4E are schematic diagrams to conceptually describe a layout of the semiconductor device of the second embodiment. FIG. 5 is a flowchart to describe the semiconductor device design method of the second embodiment.

Figure 17B:
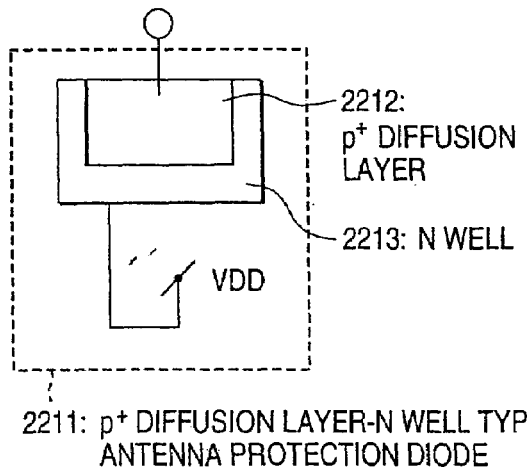

The embodiment is characterized by the fact that repeater cells each comprising a buffer or an inverter and an n+ diffusion layer-P well type protection diode (or a p+ diffusion layer-N well type antenna protection diode; for the structures of the diodes, see FIGS. 17A and 17B) connected to an input pin of the buffer or the inverter for preventing antenna damage or an antenna rule error from occurring are previously registered by registration means 511 or at a registration step S801 as the cells to be registered in a cell library 505 and that whether or not a wiring conductor-conducting to a gate electrode becomes an antenna ratio exceeding an allowed antenna ratio in the semiconductor device is determined by determination means 514 or at a determination step S804 and if the wiring conductor exceeds the allowable antenna ratio, one or more repeater cells are inserted into any point of the wiring conductor by selection means 515 or at a selection step S805.

Figure 18A:
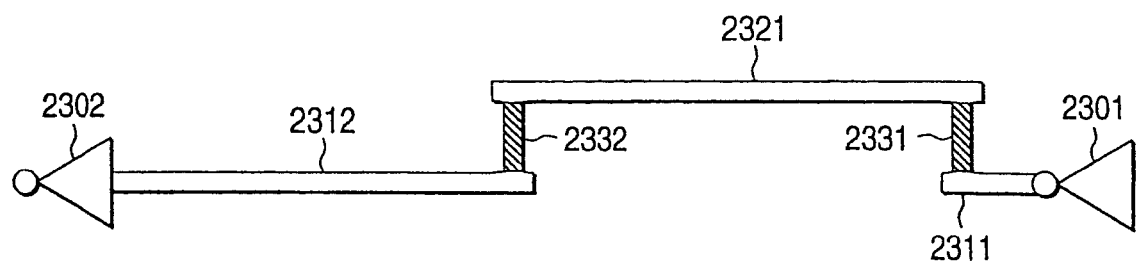
FIG. 18A is a schematic diagram to describe a layout of signal Wiring from one inverter to another inverter and FIGS. 18B and 18C are schematic diagrams to describe methods of adding an antenna protection diode.
Figure 18B:
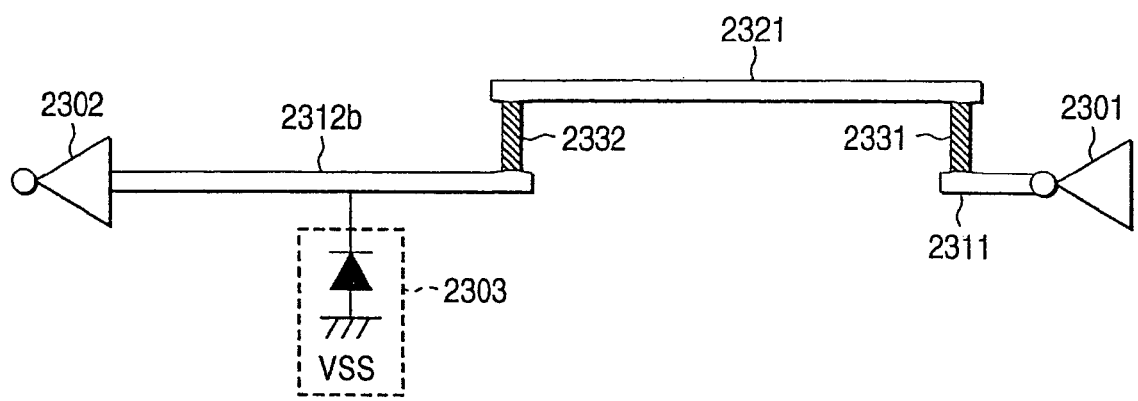
Figure 18C:
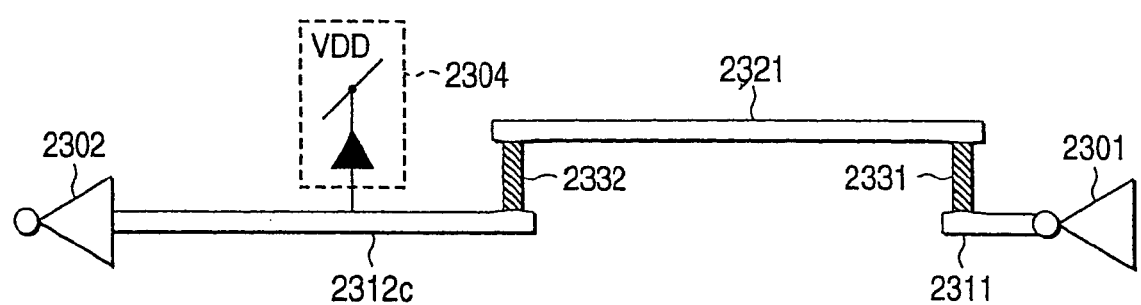
Figure 19A:
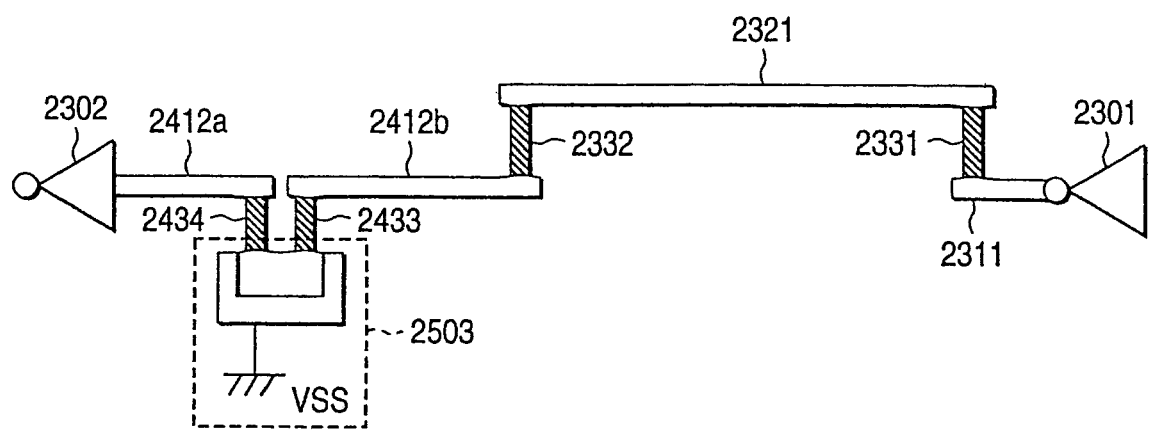
FIG. 19A is a schematic diagram to describe a method of providing diffusion layer wiring at an intermediate point of first metal wiring and FIG. 19B is a schematic diagram to describe a method of specifying upper layer wiring and again performing automatic wiring processing.
Figure 19B:
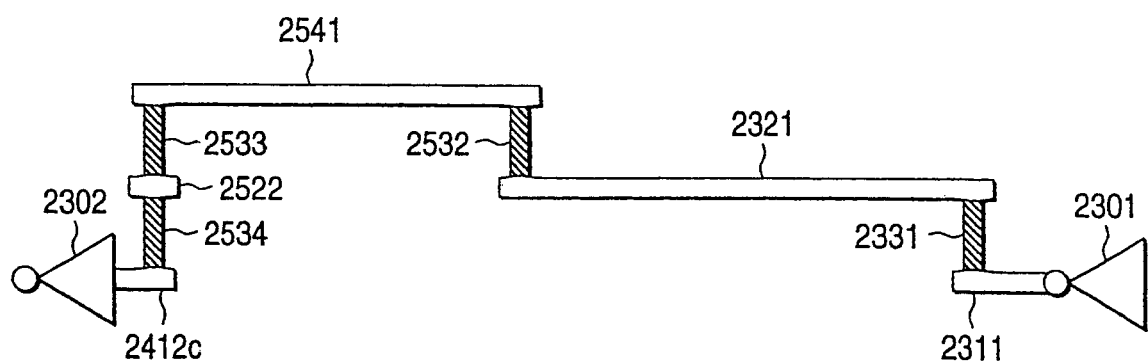

The semiconductor device of the embodiment will be discussed with reference to the schematic diagrams of FIGS. 4A to 4E. In the related art, in the layout where the first metal wiring 2312 which is very long exists, as shown in FIG. 18A, when the first metal wiring 2312 is etched, the drain diffusion layer of the inverter 2301 is not connected to the first metal wiring 2312 and the wiring can cause antenna damage for the transistor gate oxide film of the inverter 2302. To counter the problem, in FIG. 4A, long wiring is divided by a buffer 704, called a repeater, for lessening the antenna ratio to a gate oxide film of the inverter 702. Hitherto, the repeater has been used to suppress an RC delay of long wiring; such use shows an effect on both shortening of the signal propagation delay time and countermeasures against an antenna rule error.

Figure 4A:
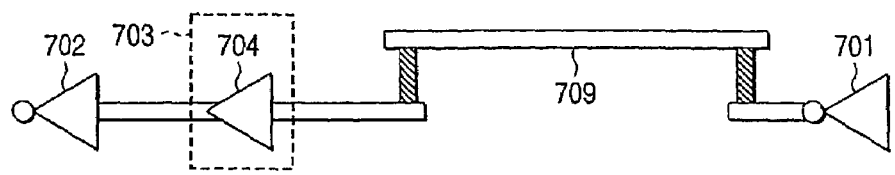
FIGS. 4A to 4E are schematic diagrams to conceptually describe a layout of a semiconductor device of a second embodiment of the invention.
Figure 4B:
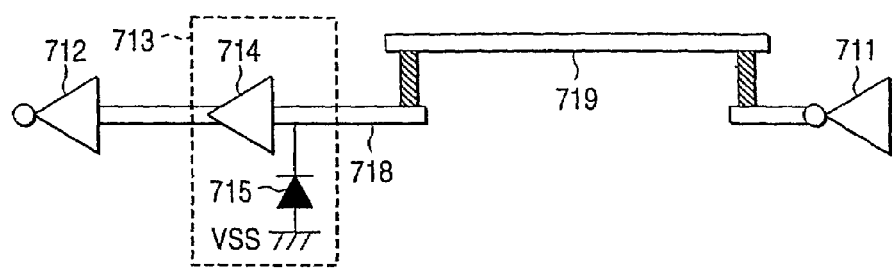
Figure 5:
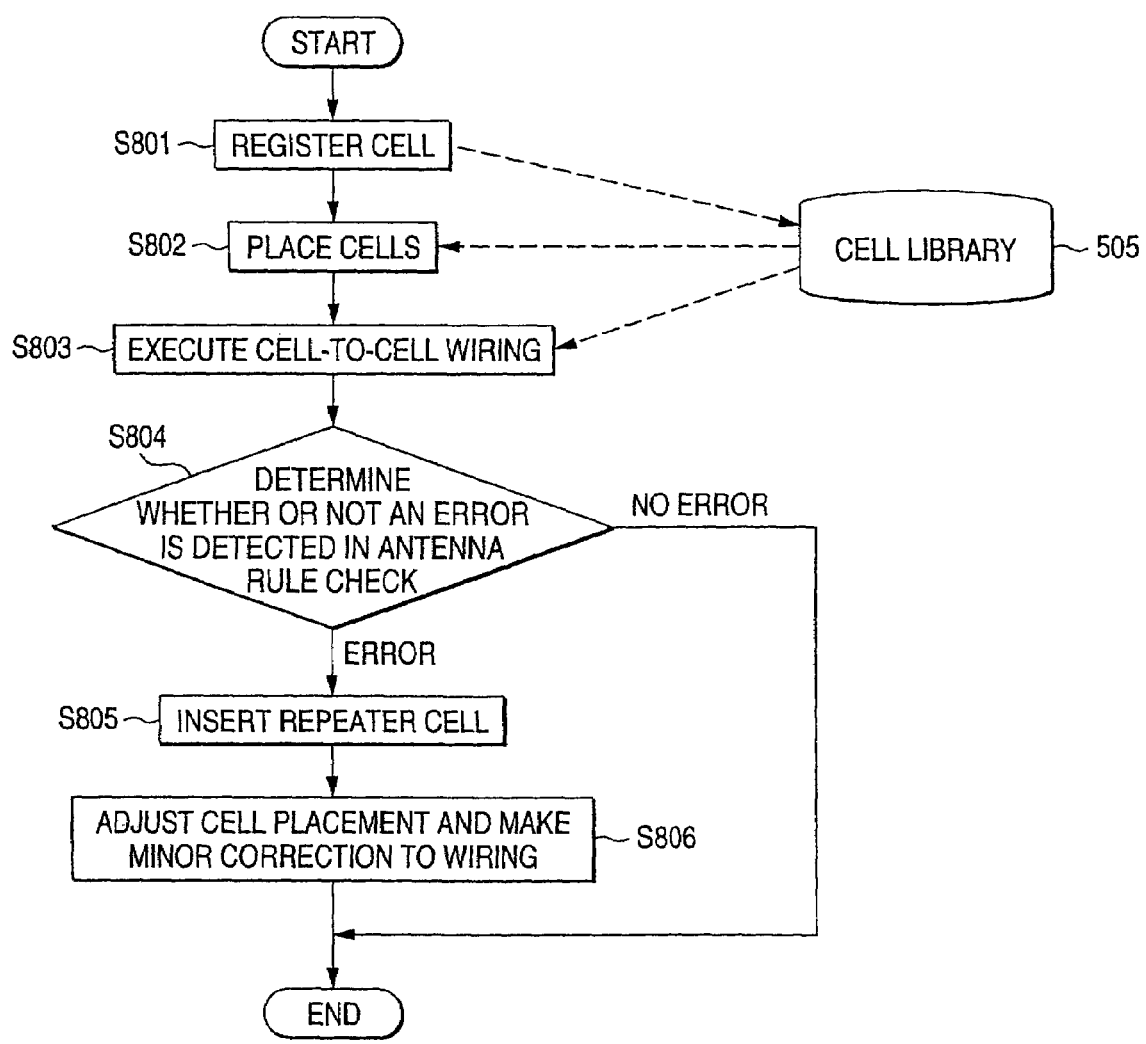
FIG. 5 is a flowchart to describe a semiconductor device design method of the second embodiment of the invention.

FIG. 4B shows an example of a repeater cell 713 made up of a buffer 714 and an n+ diffusion layer-P well type protection diode 715 connected to an input pin of the buffer 714. If a repeater cell 703 is made of the buffer 704 as in FIG. 4A, antenna damage may occur in a transistor gate oxide film of the buffer 704. Then, as shown in FIG. 4B, preferably the n+ diffusion layer-P well type protection diode 715 is added to the input pin of the buffer 714 for preventing antenna damage or an antenna rule error from occurring, whereby occurrence of antenna damage can be prevented reliably.

Figure 4C:
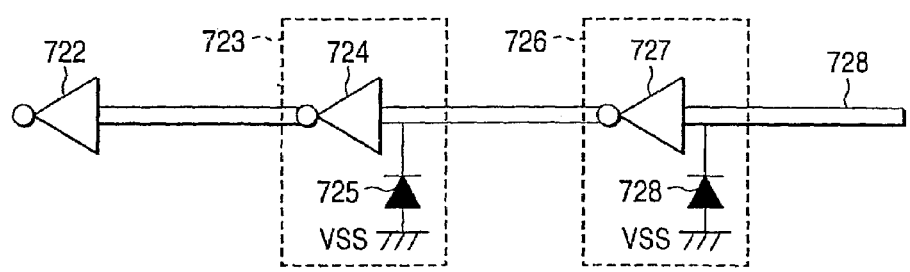

A repeater cell can comprise an inverter in place of a buffer. In this case, since the signal wiring logic is inverted by the inverter, two repeater cells are inserted almost at equal intervals. That is, as shown in FIG. 4C, wiring causing an antenna rule error is divided into three parts and a repeater cell 723 made up of an inverter 724 and an n+ diffusion layer-P well type protection diode 725 connected to an input pin of the inverter 724 and a repeater cell 726 made up of an inverter 727 and an n+ diffusion layer-P well type protection diode 728 connected to an input pin of the inverter 727 are inserted into the division points.

Figure 4D:
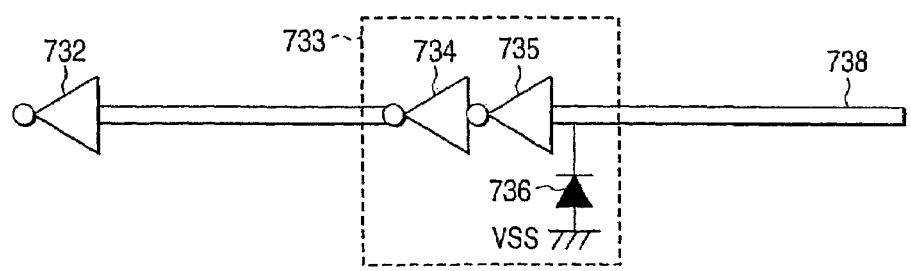
Figure 4E:
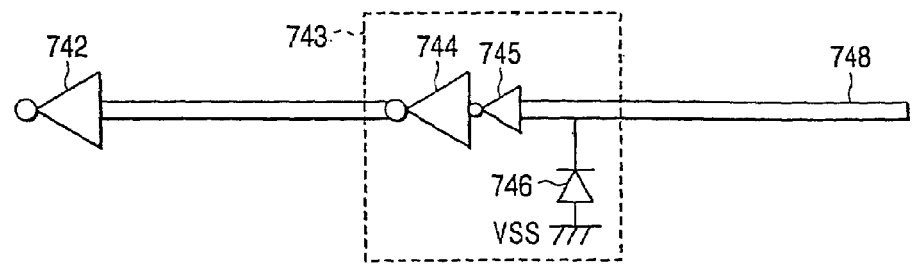

Further, a repeater cell can also comprise two inverters connected in series. That is, as shown in FIG. 4D, a repeater cell 733 is made up of inverters 734 and 735 and an n+ diffusion layer-P well type protection diode 736 connected to an input pin of the inverter 735. In this case, more practically, the area of an output inverter 744 is made larger than that of an input inverter 745 for providing different drive capabilities for the output and the input as in a repeater cell 743 shown in FIG. 4E.

Next, semiconductor device design support system 502 of the embodiment has the configuration shown in FIG. 2 like that of the first embodiment. In the second embodiment, however, numeral 515 is insertion means for inserting one or more repeater cells into any point of the wiring conductor where an antenna rule error occurs.

In the embodiment, a layout of the semiconductor device is designed as follows: In the flowchart of FIG. 5, first at step S801, a cell is registered in the cell library 505 by the registration means 511. The registered cells include repeater cells each comprising a buffer or an inverter and an n+ diffusion layer-P well type protection diode or a p+ diffusion layer-N well type antenna protection diode connected to an input pin of the buffer or the inverter for preventing antenna damage or an antenna rule error from occurring. At step S802, cells are combined and placed by cell placement means 512 while referencing the cell library 505 according to given logical circuit specifications 501. At step S803, wiring between the placed cells is determined by cell-to-cell wiring means 513 while referencing the cell library 505 according to the given logical circuit specifications 501.

Next, at step S804, a wiring conductor is checked for antenna rule by determination means 514. That is, whether or not the wiring conductor conducting to a gate electrode satisfies the allowable antenna ratio is determined. If the wiring conductor exceeds the allowable antenna ratio (an antenna rule error occurs), control goes to step S805 at which one or more repeater cells are inserted into any point of the wiring conductor by the insertion means 515. Further, at step S806, placement and wiring correction means 516 adjusts placement of other cells affected by inserting the repeater cell or cells and makes a minor correction to the cell-to-cell wiring after the placement is adjusted. If no antenna rule error occurs at step S804, then the layout design is terminated.

As described above, in the embodiment, a long wiring conductor where it is feared that antenna damage or an antenna rule error may occur is divided by inserting one or more repeater cells, whereby the signal propagation delay of the wiring can be suppressed. As the length of the wiring is shortened, antenna damage is suppressed. Further, a protection diode is added to an input pin of a repeater cell, whereby antenna damage or an antenna rule error does not occur either for the divided metal wiring connected to the repeater cell.

Third Embodiment

Next, a semiconductor device, a semiconductor device design support system, and a semiconductor device design method according to a third embodiment will be discussed with reference to FIG. 15. FIG. 15 is a schematic diagram to conceptually describe a layout of the semiconductor device of the fourth embodiment.

In FIG. 15, parts (a) and (b) are schematic diagrams to show a state in which an unused input pin of an inverter 2041 is connected to a power supply trunk and potential is fixed. The part (a) is a plan schematic diagram viewed from above the semiconductor device and the part (b) is a sectional schematic diagram taken on line A–A' in the part (a). In FIG. 15, the unused input pin of the inverter 2041 is connected via first metal wiring 2015 to a second metal power supply trunk 2021 (2022) and potential is fixed. The second metal power supply trunk 2021 (2022) is connected to a third metal power supply trunk 2031. The second metal power supply trunk 2021 indicates wiring of VSS and the second metal power supply trunk 2022 indicates wiring of VDD. When the second metal is etched in the wiring step of such configured LSI, the third metal power supply trunk 2031 does not yet exist. Thus, the second metal power supply trunk 2021 becomes giant antenna wiring in a floating state not connected to a diffusion layer with respect to a gate oxide film connected to the input pin of the inverter 2041.

In the embodiment, the following countermeasures are taken for the second metal power supply trunk 2021 (2022) when such an antenna rule error can occur: a part (c) of FIG. 15 is a plan schematic diagram viewed from above the semiconductor device for which countermeasures against an antenna rule error are taken according to the embodiment and a part (d) is a sectional schematic diagram taken on line B–B' in the part (c). As shown here, if the unused input pin of the inverter 2041 is connected to the second metal power supply trunk 2021 of VSS, a p+ diffusion layer 2008 is formed on a P well 2007, a substrate contact connected from the p+ diffusion layer 2008 via a via-electrode and first metal wiring 2014 to the second metal power supply trunk 2021 is used, and a path from the second metal power supply trunk 2021 via the p+ diffusion layer 2008 to the P well 2007 is formed. If the unused input pin of the inverter 2041 is connected to the second metal power supply trunk 2022 of VDD, an n+ diffusion layer 2006 is formed on an N well 2005, a substrate contact connected from the n+ diffusion layer 2006 via a via-electrode and first metal wiring 2013 to the second metal power supply trunk 2022 is used, and a path from the second metal power supply trunk 2022 via the n+ diffusion layer 2006 to the N well 2005 is formed. To assign such a substrate contact, a part area where the substrate contact can be placed is found by performing mask operation and the substrate contact is automatically generated in the found part area. To find a part area where the substrate contact can be placed, a technique of seeing all layers of a diffusion layer, a polysilicon layer, etc., a technique of seeing standard cells and block cells and determining that the substrate contact cannot be placed in the cells, or the like can be used.

As described above, in the embodiment, a substrate contact of n+ diffusion layer-N well type is generated for the power supply VDD or a substrate contact of p+ diffusion layer-P well type is generated for the power supply VSS by performing mask operation, whereby a path flowing into the diffusion layer is provided even in the configuration to which a protection diode is not added. Thus, to connect an unused pin to a power supply trunk and fix the potential of the unused pin, an antenna rule error is not caused. Since the well potential tends to be stable, noise resistance, latch-up resistance, and the like of the semiconductor device are also improved.

Fourth Embodiment

Next, a semiconductor device, a semiconductor device design support system, and a semiconductor device design method according to a fourth embodiment will be discussed with reference to FIGS. 6A to 6D. FIGS. 6A to 6D are schematic diagrams to conceptually describe a layout of the semiconductor device of the fifth embodiment.

The embodiment is characterized by the fact that when it is assumed that the ratio between the area of a wiring conductor conducting to a gate electrode and the area of the gate electrode is an antenna ratio, each wiring conductor conducting to a gate electrode in each wiring layer is limited to the area or wiring length as an antenna ratio of less than a half the allowed antenna ratio in the semiconductor device and is divided into at least three parts for wiring.

Figure 6A:
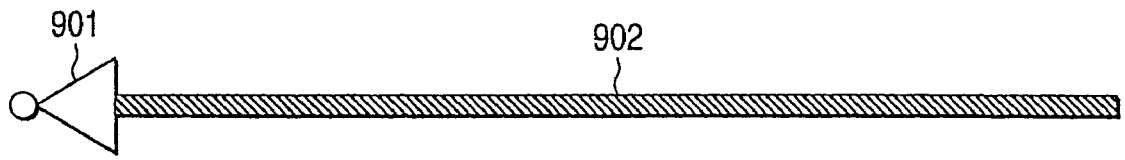
FIGS. 6A to 6D are schematic diagrams to conceptually describe a layout of a semiconductor device of a fourth embodiment of the invention.
Figure 6B:
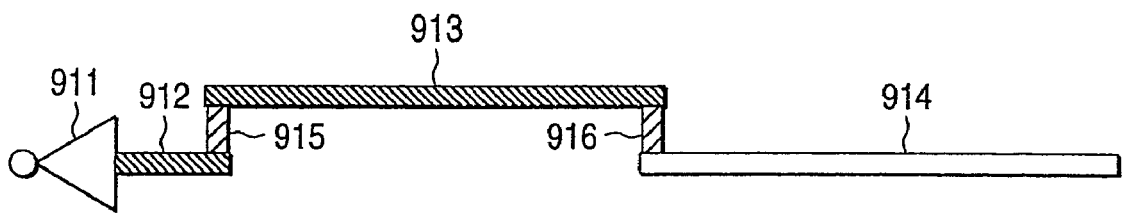
Figure 6C:
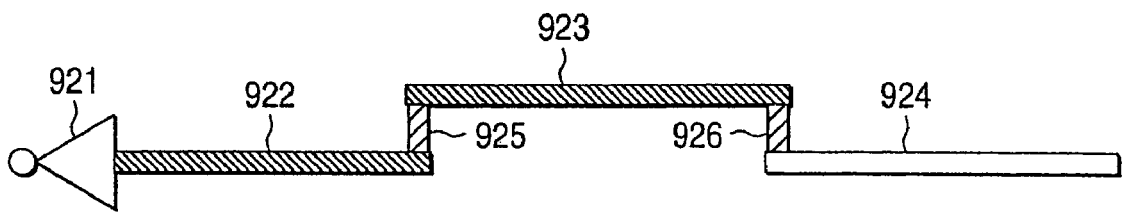

The semiconductor device of the embodiment will be discussed with reference to the schematic diagrams of FIGS. 6A to 6D. FIG. 6A schematically shows a wiring layout of metal wiring 902 of a jth wiring layer connected to the input end of one inverter 901. In FIG. 6B, to prevent occurrence of such an antenna rule error for the long metal wiring 902 to exceed the allowable antenna ratio, the length of one signal wiring that can be run on one wiring layer in a cell-to-cell wiring step is limited to a half the rule value or less. That is, the wiring is made up of metal wiring 912 of the jth wiring layer, metal wiring 913 of a (j+1)th wiring layer, and metal wiring 914 of the jth wiring layer. In FIG. 6C, the length is set to a third the rule value or less and the wiring is made up of metal wiring 922 of the jth wiring layer, metal wiring 923 of the (j+1)st wiring layer, and metal wiring 924 of the jth wiring layer.

For example, in FIG. 6A, assuming that when charges exceeding charge amount Q are accumulated in the metal wiring 902, antenna damage occurs in a gate oxide film of the inverter 901, the charge amount flowing into the gate oxide film at the etching time of the (j+1)th wiring layer can be reduced to about a little more than a half by dividing the metal wiring 902 of the jth wiring layer into three parts so that the wiring length of the metal wiring 913 of the (j+1)st wiring layer becomes less than a half the antenna ratio as in FIG. 6B or the charge amount flowing into the gate oxide film at the etching time of the (j+1)st wiring layer can be reduced to about two thirds by dividing the wiring into three parts as in FIG. 6C; occurrence of antenna damage can be suppressed.

Figure 6D:
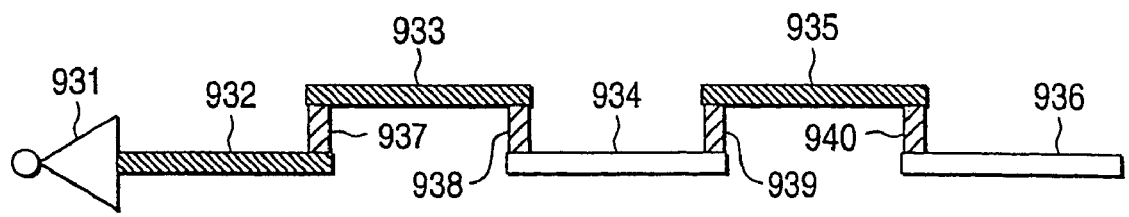

In FIG. 6D, the length of one signal wiring that can be run on one wiring layer is limited to a fifth the rule value or less, and the wiring is made up of metal wiring 932, 934, and 936 of the jth wiring layer and metal wiring 933 and 935 of the (j+1)th wiring layer, whereby the metal wiring 936 of the jth wiring layer (open portion), when its pattern is etched, is not connected to a gate oxide film of an inverter 931 and charges are not accumulated in the metal wiring 934 of the jth wiring layer at the etching time of the (j+1)th wiring layer. Thus, the charge amount flowing into the gate oxide film of the inverter 931 can be reduced to about three fifths and occurrence of antenna damage can be suppressed.

As described above, in the embodiment, the length of wiring continuously running in the same wiring layer is limited to less than a half the original antenna rule value and is divided into at least three parts, whereby wiring forcibly is changed, long wiring can be divided, and the antenna ratio of wiring can be suppressed; resultantly, the number of antenna error occurrences can be decreased.

Sixth Embodiment

Figure 7A:
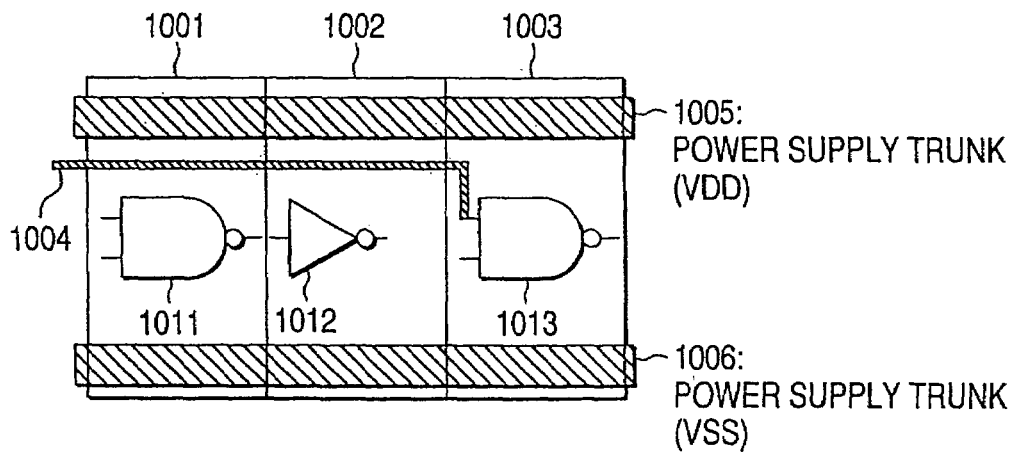
FIGS. 7A to 7C are schematic diagrams to conceptually describe a layout of a semiconductor device of a fifth embodiment of the invention.
Figure 7B:
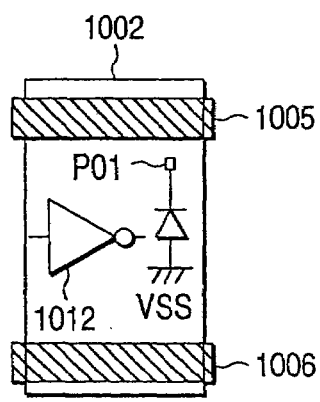
Figure 7C:
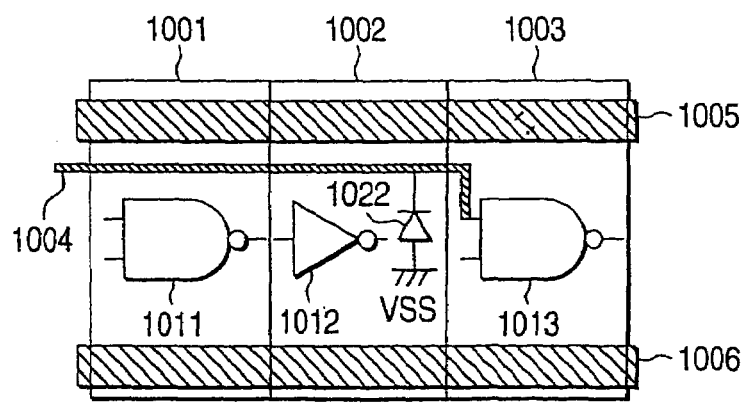
Figure 8:
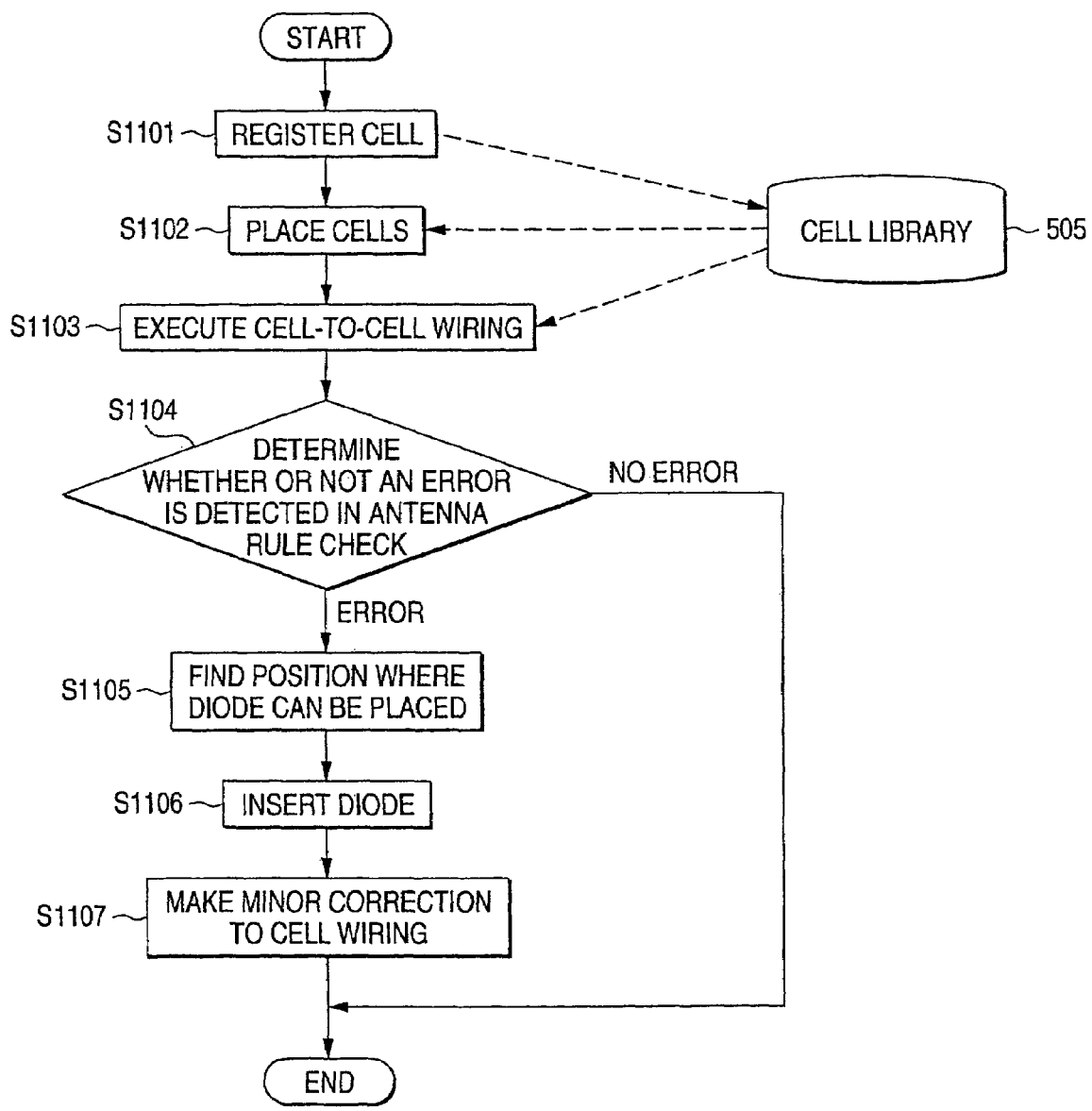
FIG. 8 is a flowchart to describe a semiconductor device design method of the fifth embodiment of the invention.

Next, a semiconductor device, a semiconductor device design support system, and a semiconductor device design method according to a fifth embodiment will be discussed with reference to FIG. 2, FIGS. 7A to 7C, and FIG. 8. FIGS. 7A to 7C are schematic diagrams to conceptually describe a layout of the semiconductor device of the fifth embodiment. FIG. 8 is a flowchart to describe the semiconductor device design method of the fifth embodiment.

The embodiment is characterized by the fact that a position where an n+ diffusion layer and a contact can or cannot be placed on a P well or a position where a p+ diffusion layer and a contact can or cannot be placed on an N well is defined as shape data of a cell to be registered in a cell library 505 by registration means 511 or at a registration step S1101 and that whether or not a wiring conductor conducting to a gate electrode becomes an antenna ratio exceeding an allowed antenna ratio in the semiconductor device is determined by determination means 514 or at a determination step S1104 and if the wiring conductor exceeds the allowable antenna ratio, a placeable position or a position that is not an unplaceable position is found and an n+ diffusion layer-P well type protection diode or a p+ diffusion layer-N well type antenna protection diode is inserted by insertion means 515 or at an insertion step S1106.

The semiconductor device of the embodiment will be discussed with reference to the schematic diagrams of FIGS. 7A to 7C. FIG. 7A is a schematic diagram to illustrate a layout of placement and wiring in a standard cell method. In the figure, a cell 1001 comprising a NAND gate circuit 1011, a cell 1002 comprising a NOT gate circuit 1012, and a cell 1003 comprising a NAND gate circuit 1013 adjoin in placement. A VDD power supply trunk 1005 is wired above the cells and a VSS power supply trunk 1006 is wired below the cells. A wiring conductor 1004 is connected to one input of the NAND gate circuit 1013.

For cells having comparatively an empty area, such as the cell 1002 comprising the NOT gate circuit 1012, of the cells registered in the cell library 505, a position where an n+ diffusion layer and a contact can be placed on a P well or a position where a p+ diffusion layer and a contact can be placed on an N well is previously defined in the form as shown in P01 in FIG. 7B.

In FIG. 7A, if the wiring conductor 1004 is determined wiring causing an antenna rule error, a placeable position is found on the path of the wiring conductor 1004 and as shown in FIG. 7C, an n+ diffusion layer-P well type protection diode 1022 is placed in the position P01 for preventing an antenna rule error from occurring.

Next, semiconductor device design support system 502 of the embodiment has the configuration shown in FIG. 2 like that of the second embodiment. In the sixth embodiment, however, numeral 515 is insertion means for finding a placeable position in the proximity of the wiring conductor when an antenna rule error occurs and inserting an n+ diffusion layer-P well type protection diode or a p+ diffusion layer-N well type antenna protection diode.

In the embodiment, a layout of the semiconductor device is designed as follows: In the flowchart of FIG. 8, first at step S1101, a cell is registered in the cell library 505 by the registration means 511. A position where an n diffusion layer and a contact can be placed on a P well or a position where a p+ diffusion layer and a contact can be placed on an N well, namely, a position into which an n+ diffusion layer-P well type protection diode or a p+ diffusion layer-N well type antenna protection diode can be inserted is defined as the shape data of the registered cell. At step S1102, cells are combined and placed by cell placement means 512 while referencing the cell library 505 according to given logical circuit specifications 501. At step S1103, wiring-between the placed cells is determined by cell-to-cell wiring means 513 while referencing the cell library 505 according to the given logical circuit specifications 501.

Next, at step S1104, a wiring conductor is checked for antenna rule by determination means 514. That is, whether or not the wiring conductor conducting to a gate electrode satisfies the allowable antenna ratio is determined. If the wiring conductor exceeds the allowable antenna ratio (an antenna rule error occurs), the insertion means 515 finds a position where a protection diode can be placed in the proximity of the wiring path of the wiring conductor at step S1105 and inserts a protection diode into the found position at step S1106. Further, at step S1107, placement and wiring correction means 516 makes a minor correction to the cell-to-cell wiring affected by inserting the protection diode. If no antenna-rule error occurs at step S1104, then the layout design is terminated.

As described above, in the embodiment, to automatically insert a protection diode, it is not necessary to determine the placement position of the protection diode while seeing various related layers of a diffusion area, polysilicon, etc., in a CAD (computer aided design) system, so that the processing amount in the CAD system may be very light. Because of the structure forming a P well and an n+ diffusion layer for a P well, an area increase can be suppressed as much as the well separation distance as compared with a structure forming an N well and a p+ diffusion layer for a P well.

Sixth Embodiment

Figure 9A:
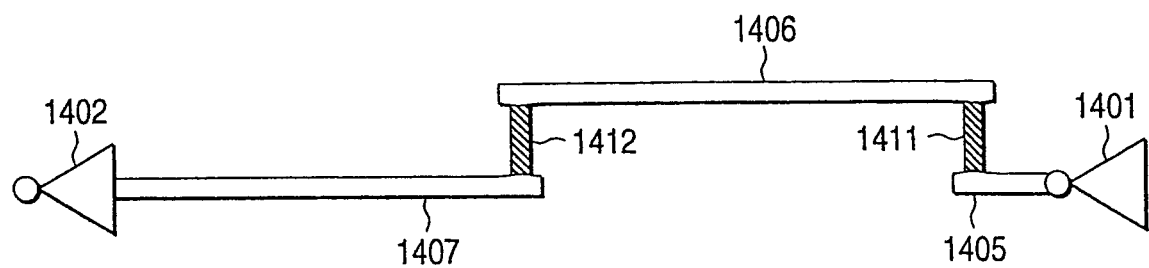
FIGS. 9A and 9B are schematic diagrams to conceptually describe a layout of a semiconductor device of a sixth embodiment of the invention.
Figure 9B:
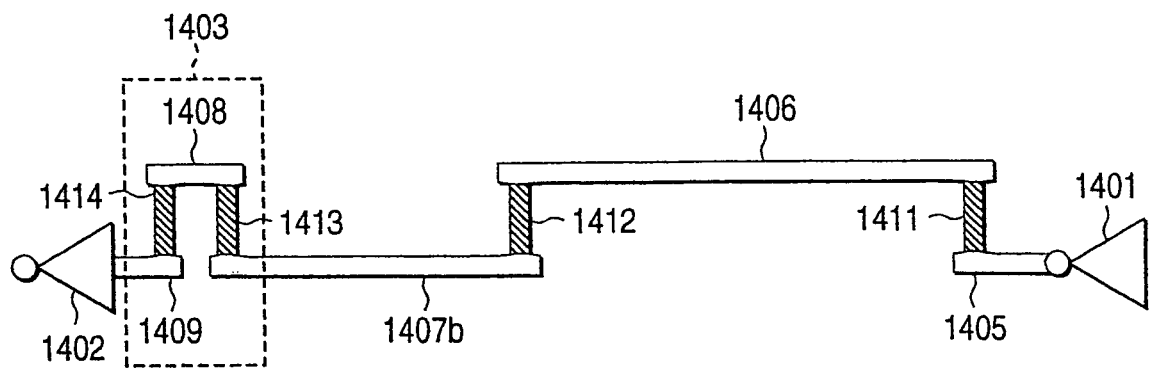
Figure 10:
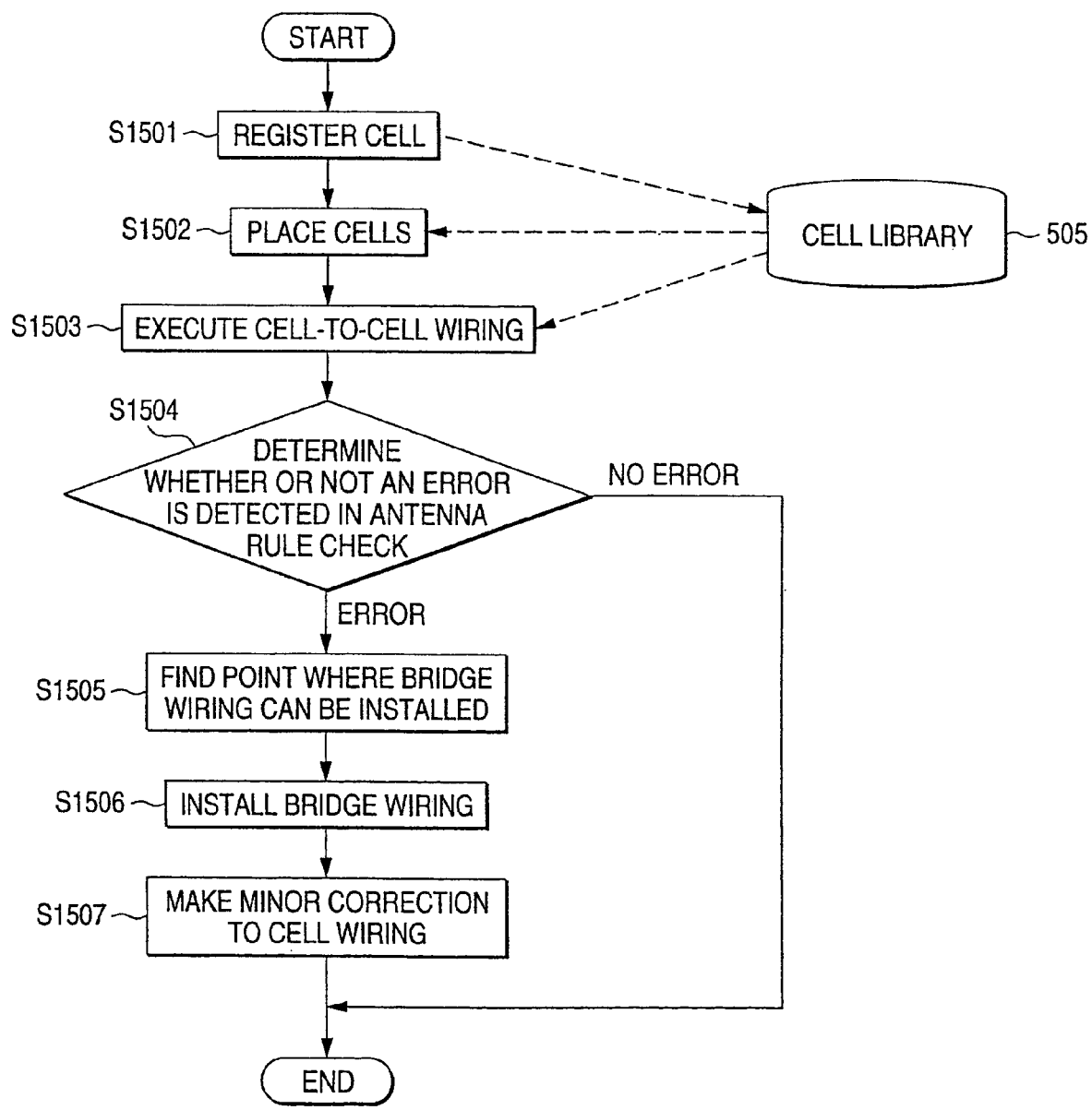
FIG. 10 is a flowchart to describe a semiconductor device design method of the sixth embodiment of the invention.

Next, a semiconductor device, a semiconductor device design support system, and a semiconductor device design method according to a sixth embodiment will be discussed with reference to FIG. 2, FIGS. 9A and 9B, and FIG. 10. FIGS. 9A and 9B are schematic diagrams to conceptually describe a layout of the semiconductor device of the eighth embodiment. FIG. 10 is a flowchart to describe the semiconductor device design method of the eighth embodiment.

The embodiment is characterized by the fact that whether or not a wiring conductor conducting to a gate electrode in the semiconductor device and having long wiring in the ith wiring layer exceeds an allowable antenna ratio is determined by determination means 514 or at a determination step S1504 and if the wiring conductor exceeds the allowable antenna ratio, the long wiring in the ith wiring layer is cut in the proximity of the gate electrode and the wiring conductor is formed by connecting the short wiring conductor part in the ith wiring layer from the gate electrode to the cut point and the long wiring conductor part in the ith wiring layer ahead the cut point by a bridge wiring conductor of a length as long as at least two grids in the jth wiring layer above the ith wiring layer (i<j≦n) by insertion means 515 or at an insertion step S1506.

The semiconductor device of the embodiment will be discussed with reference to the schematic diagrams of FIGS. 9A and 9B. As previously described in the related art, in such a layout where very long metal wiring 1407 exists in the ith wiring layer as shown in FIG. 9A, when the metal wiring 1407 in the ith wiring layer is etched, a drain diffusion layer of an inverter 1401 is not connected to the metal wiring 1407 and the wiring can cause antenna damage to a transistor gate oxide film of the inverter 1402. To counter the problem, in FIG. 9B, bridge wiring 1403 in the (i+1)st wiring layer is inserted into long wiring in the proximity of a gate electrode of the inverter 1402.

When the metal wiring in the ith wiring layer is etched, long wiring 1407b in the ith wiring layer is disconnected from the gate electrode of the inverter 1402 because the bridge wiring 1403 exists. As the bridge wiring 1403 exists, after the wiring conductor is divided, wiring 1409 connected to the gate electrode side is shortened, also providing the advantage of suppressing antenna damage to the gate oxide film of the inverter 1402.

Next, semiconductor device design support system 502 of the embodiment has the configuration shown in FIG. 2 like that of the second embodiment. In the eighth embodiment, however, numeral 515 is insertion means for cutting long wiring in the ith wiring layer where an antenna rule error occurs in the proximity of the gate electrode and forming the wiring conductor by connecting the short wiring conductor part in the ith wiring layer from the gate electrode to the cut point and the long wiring conductor part in the ith wiring layer ahead the cut point by a bridge wiring conductor of a length as long as at least two grids in the jth wiring layer above the ith wiring layer.

In the embodiment, a layout of the semiconductor device is designed as follows: In the flowchart of FIG. 10, first at step S1501, cells are previously registered in a cell library 505 by the registration means 511. At step S1502, cells are combined and placed by cell placement means 512 while referencing the cell library 505 according to given logical circuit specifications 501. At step S1503, wiring between the placed cells is determined by cell-to-cell wiring means 513 while referencing the cell library 505 according to the given logical circuit specifications 501.

Next, at step S1504, a wiring conductor is checked for antenna rule by determination means 514. That is, whether or not the wiring conductor conducting to a gate electrode satisfies the allowable antenna ratio is determined. If the wiring conductor exceeds the allowable antenna ratio (an antenna rule error occurs), at step S1505 the insertion means 515 cuts long wiring in the ith wiring layer in the proximity of the gate electrode and forms the wiring conductor by connecting the short wiring conductor part in the ith wiring layer from the gate electrode to the cut point and the long wiring conductor part in the ith wiring layer ahead the cut point by a bridge wiring conductor of a length as long as at least two grids in the jth wiring layer above the ith wiring layer (i<j≦n). Further, at step S1507, placement and wiring correction means 516 makes a minor correction to the cell-to-cell wiring affected by protection diode insertion. If no antenna rule error occurs at step S1504, then the layout design is terminated.

In related art, if an antenna rule error occurs or does not occur, the structure in FIG. 9A or 9B is adopted. However, with the semiconductor device of the embodiment, bridge wiring as shown in FIG. 9B is intentionally placed in the proximity of the gate electrode. Further, bridge wiring formerly existing by chance was provided for routing signal wiring. Thus, wiring in the "i+1"st wiring layer requires signal portions to ▩climb up ▩and ▩down ▩and ▩stride over ▩and therefore requires a length of at least three grids. The embodiment is intended for cutting long wiring in the ith wiring layer and connecting the cut parts via bridge wiring in the "i+1"st wiring layer, thus the wiring in the "i+1"st wiring layer needs to be only a length as long as at most two grids. The bridge wiring of the length as long as two grids is of a structure that the former bridge wiring used in the meaning of striding over another signal cannot have. The countermeasure against an antenna rule error according to the embodiment is very practical because it needs to be taken only in a wiring step and the necessity for taking the countermeasure from a transistor step as in a technique of adding a protection diode is eliminated.

Since wiring parts 1403, 1407b, and 1409 via via-electrodes 1413 and 1414 in FIG. 9B use the upper layer wiring of only a length as long as two grids as compared with the long wiring 1407 in FIG. 9A, the signal wiring length, the parasitic load capacitance for the signal wiring, and the like little change before and after the countermeasure against an antenna rule error according to the embodiment is taken. Thus, an event in which the designer has a rethink to eliminate operation timing errors on logical circuit design after the countermeasure against an antenna rule error is taken can little occur; efficient semiconductor device design is enabled.

Figure 11A:
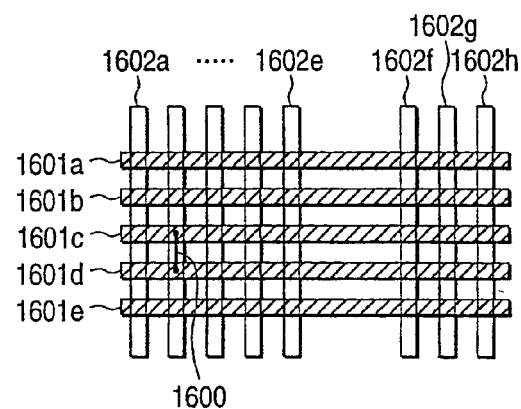
FIGS. 11A to 11D are wiring layout pattern diagrams to illustrate a specific application example of the sixth embodiment.
Figure 11B:
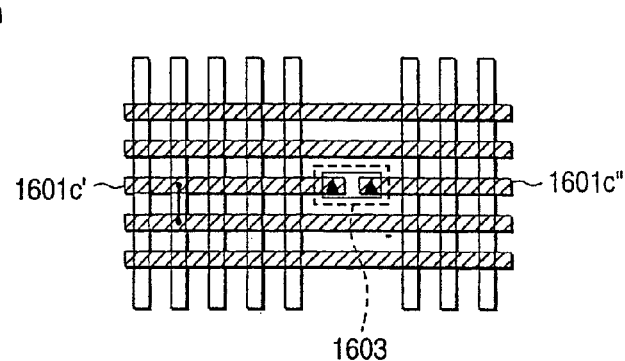
Figure 11C:
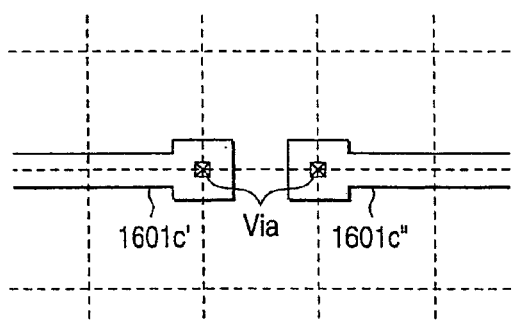
Figure 11D:
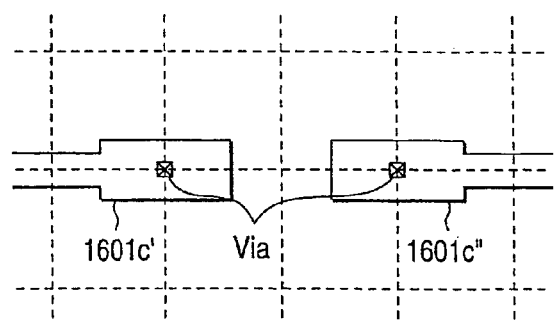

Further, a specific application example of the embodiment will be discussed with reference to FIGS. 11A to 11D. FIG. 11A is a pattern diagram before bridge wiring countermeasure is taken, FIG. 11B is a pattern diagram after bridge wiring countermeasure is taken, FIG. 11C is a schematic representation of bridge wiring with equal direction margin, and FIG. 11D is a schematic representation of bridge wiring with different direction margin.

Here, an algorithm is used for finding an area of two or more contiguous empty grids in the jth wiring layer overlapping long wiring in the ith wiring layer is found from the side near a gate electrode relative to the long wiring in the ith wiring layer by search means 517 (at finding step 1505) and inserting the above-mentioned bridge wiring conductor into the found area in insertion means 515.

For example, in FIG. 11A, assume that metal wiring 1601c in the ith wiring layer is determined an antenna rule error in a wiring layout having metal wirings 1601a to 1601e in the ith wiring layer, metal wirings 1602a to 1602h in the (i+1)th wiring layer, and metal wiring 1600 in the (i−1)th wiring layer leading to a gate oxide film.

In this case, as a countermeasure, an area of two or more contiguous empty grids in the (i+1)th wiring layer above the metal wiring. 1601c in the ith wiring layer is found from the side connected to the metal wiring 1600 in the (i−1)th wiring layer near the gate oxide film. If two contiguous empty grids do not exist, they may be generated. The metal wiring 1601c in the ith wiring layer forming antenna wiring is cut into two parts in the area of the two contiguous empty grids and metal wiring cuts 1601c' and 1601" in the ith wring layer are connected by bridge wiring 1603 in the (i+1)th wiring layer having a length of two grids. Triangle symbols of connection points in the figure denote connection via-electrodes of the ith wiring layer metal and the (i+1)th wiring layer metal. In the specific example shown in FIGS. 11A to 11D, an area of at least two contiguous empty grids is required in the (i+1)th wiring layer, but a new wiring grid is not required in the ith wiring layer. Very small change is only required as a layout pattern and circuit performance; the specific example is an ideal application example.

Since the description made so far assumes that the meal wiring is equal direction margin to the via-electrodes as shown in FIG. 11C, the countermeasure is provided by the bridge wiring 1603 of the two-grid length. However, it should be noted that to connect bridge wiring in the long direction of the contact form if the meal wiring is different direction margin from the via-electrodes as shown in FIG. 11D, the bridge wiring becomes a length of three grids (to connect bridge wiring in the short direction of the contact form, it may be a length of two grids). The different direction margin is designed so that wiring pitches can be narrowed with one direction as marginless; projection metal called a reserver is added in order to provide a contact area and electromigration resistance.

As described above, in the embodiment, if two empty grids of wiring exist in the jth wiring layer of an upper layer (or if two empty grids can be generated), antenna damage or an antenna rule error can be prevented from occurring. The point where bridge wiring is placed is determined by finding an area from the side near the gate electrode of long wiring, so that occurrence of antenna damage caused by the remaining wiring leading to the gate electrode side after the long wiring is cut by the bridge wiring can also be suppressed. Since empty grids of wiring in the jth wiring layer are used, a large move of any other wiring little occurs, the whole layout little changes before and after the bridge wiring countermeasure against an antenna rule error is taken, and signal timing change on a large logical circuit does not occur either. Since an upper wiring layer is used, if an mask order is started in order from the bottom in parallel with layout design to shorten the design period, a wiring layout of upper wiring layers can be handled easily to deal with the antenna rule and countermeasures against an antenna rule error can be taken effectively.

First Modification of Sixth Embodiment

Next, a countermeasure to be taken if two or more contiguous empty grids do not exist in the jth wiring layer of an upper layer in the insertion means. 515 (or search means 517 or at finding step 1505) will be discussed.

In a first modification of the sixth embodiment, a first area of an empty grid in the jth wiring layer overlapping long wiring in the ith wiring layer is found from the side near a gate electrode relative to the long wiring in the ith wiring layer, the position of the ith wiring layer overlapping the first area is set to a cut point of the long wiring, the long wiring conductor ahead the cut point in the ith wiring layer is moved to another empty area containing a second area in the jth wiring layer overlapping the cut point after the move, and the wiring conductor spread over the first and second areas is adopted as the bridge wiring conductor in the jth wiring layer.

Figure 12A:
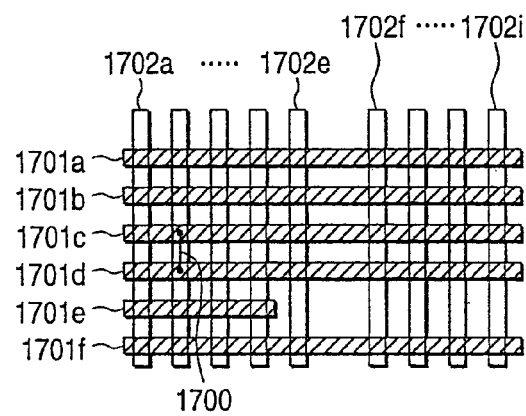
FIGS. 12A and 12B are layout pattern diagrams (No. 1) to describe a countermeasure to be taken if two or more contiguous empty grids of wiring do not exist.
Figure 12B:
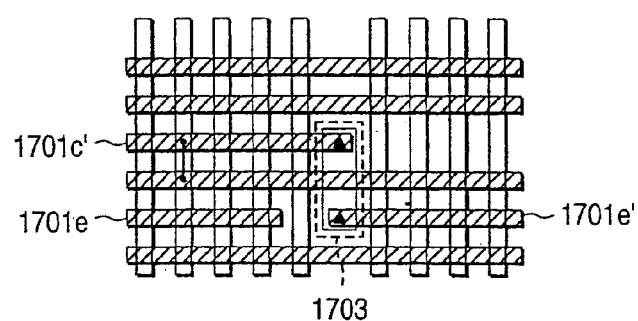

FIG. 12 is layout pattern diagrams to describe a countermeasure to be taken if two or more contiguous empty grids of wiring do not exist in the (i+1)th wiring layer; FIG. 12A is a pattern diagram before countermeasure is taken and FIG. 12B is a pattern diagram after countermeasure is taken. First, in FIG. 12A, assume that metal wiring 1701c in the ith wiring layer is determined an antenna rule error in a wiring layout having metal wirings 1701a to 1701f in the ith wiring layer, metal wirings 1702a to 1702i in the (i+1)th wiring layer, and metal wiring 1700 in the (i−1)th wiring layer leading to a gate oxide film.

In this case, as a countermeasure, first an area of two or more contiguous empty grids in the (i+1)th wiring layer above the metal wiring 1701c in the ith wiring layer is found from the side connected to the metal wiring 1700 in the (i−1)th wiring layer near the gate oxide film, but is not found. Then, a first area of an empty grid in the (i+1)th wiring layer above the metal wiring 1701c in the ith wiring layer is found from the side near the gate oxide film. One end of bridge wiring in the (i+1)th wiring layer is taken from the first area and the wiring 1701c in the ith wiring layer is cut as wiring 1701c'. Next, a second area of an empty grid in the nth wiring layer below the first area in the (i+1)th wiring layer is found and whether or not the wiring conductor in the ith wiring layer ahead the cut point can be moved to an empty area containing the second area is determined. If it can be moved to the area, the wiring conductor moved to the area as wiring 1701e' and the second area is adopted as another end of the bridge wiring.

As described above, in the modified form, even if two or more contiguous empty grids of wiring do not exist in the jth wiring layer of an upper layer, if a first area of an empty grid in the jth wiring layer, an area to which the wiring conductor ahead the cut point in the ith wiring layer can be moved, and a second area of an empty grid in the jth wiring layer can be found, antenna damage or an antenna rule error can be reliably prevented from occurring.

Second Modification of Sixth Embodiment

In a second modification of the sixth embodiment, if an insertion area cannot be determined, a first area of an empty grid in the jth wiring layer overlapping long wiring in the ith wiring layer is found from the side near a gate electrode relative to the long wiring in the ith wiring layer, a bridge wiring conductor in the jth wiring layer is inserted to a second area of a length as long as at least two grids from the first area, and wiring conductor in the ith wiring layer overlapping the second area is again wired.

Thus, even if two or more contiguous empty grids of wiring do not exist in the jth wiring layer of an upper layer, if a first area of an empty grid in the jth wiring layer can be found, antenna damage or an antenna rule error can be reliably prevented from occurring. Since the wiring layout is corrected as the wiring is shifted as a whole, the layout of the wiring conductors is not largely changed and the operation timing, etc., little changes before and after the countermeasure against an antenna rule error is taken.

Figure 13A:
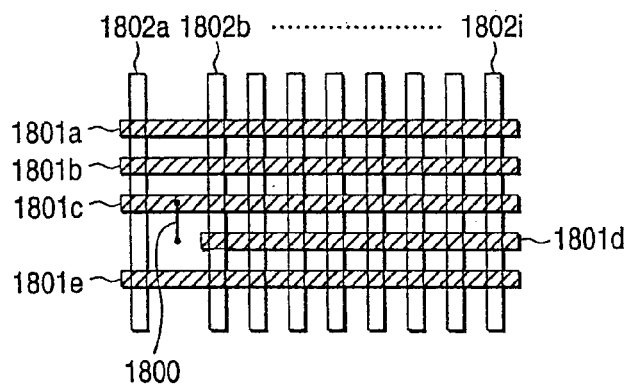
FIGS. 13A and 13B are layout pattern diagrams (No. 2) to describe a countermeasure to be taken if two or more contiguous empty grids of wiring do not exist.
Figure 13B:
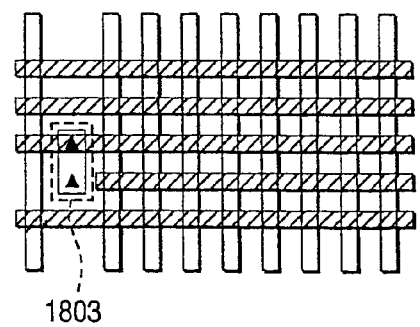

A special case will be discussed with reference to FIGS. 13A and 13B. In the special case, as shown in FIG. 13A, if a wiring grid is empty in the (i+1)th wiring layer above wiring 1800 in the (i−1)th wiring layer to a gate oxide film and there is a changeable point to the ith wiring layer below the grid, the empty grid above the wiring 1800 is used to install bridge wiring with the upper wiring layer. It seems that such a case exists by accident and is extremely rare, but if any other wiring above an input pin is forcibly removed and a wiring bridge with an upper wiring layer is added to the input pin and then a layout is again made, such a special case is applied.

Third Modification of Sixth Embodiment

In a third modification of the sixth embodiment, if an insertion area cannot be determined, a first area and a second area which are discontiguous and contain each an empty grid in the jth wiring layer overlapping long wiring in the ith wiring layer are found from the side near a gate electrode relative to the long wiring in the ith wiring layer and a bridge wiring conductor in the kth wiring layer above the jth wiring layer (j<k≦n) is inserted between the first and second areas.

Figure 14A:
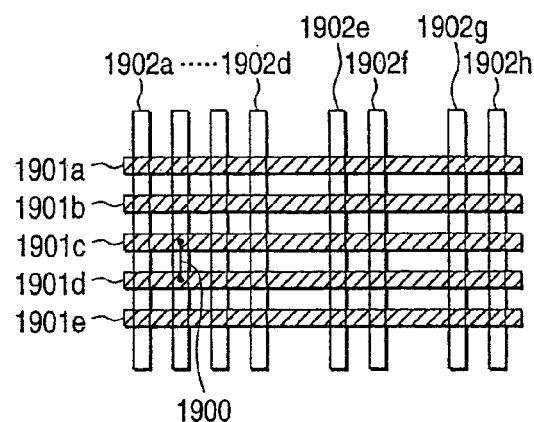
FIGS. 14A to 14C are layout pattern diagrams (No. 3) to describe a countermeasure to be taken if two or more contiguous empty grids of wiring do not exist.
Figure 14B:
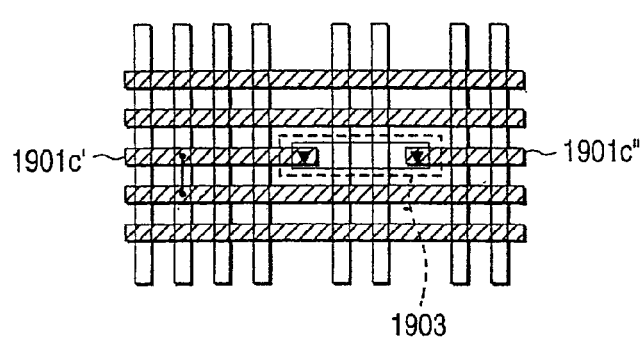
Figure 14C:
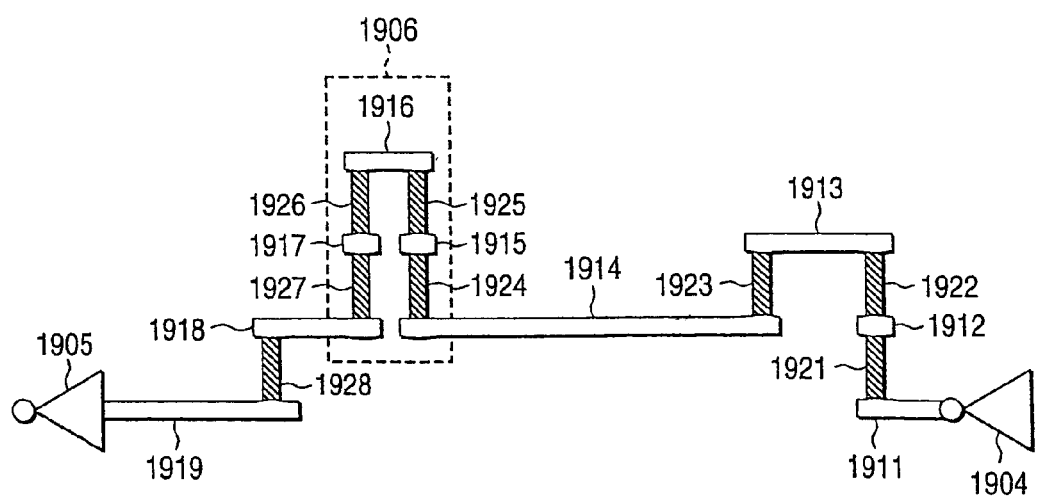

FIGS. 14 are layout pattern diagrams to describe a countermeasure to be taken if two or more contiguous empty grids of wiring do not exist in the (i+1)th wiring layer; FIG. 14A is a pattern diagram before countermeasure is taken, FIG. 14B is a pattern diagram after countermeasure is taken, and FIG. 14C is a schematic diagram to describe wiring after countermeasure is taken. First, in FIG. 14A, assume that metal wiring 1901*c* in the ith wiring layer is determined an antenna rule error in a wiring layout having metal wirings 1901*a* to 1901*e* in the ith wiring layer, metal wirings 1902*a* to 1902*h* in the (i+1)th wiring layer, and metal wiring 1900 in the (i−1)th wiring layer leading to a gate oxide film.

In this case, as a countermeasure, first an area of two or more contiguous empty grids in the (i+1)th wiring layer above the metal wiring 1901*c* in the ith wiring layer is found from the side connected to the metal wiring 1900 in the (i−1)th wiring layer near the gate oxide film, but is not found. Then, if it can be checked that there are two distant areas each containing an empty wiring grid in the (i+1)th wiring layer above the metal wiring 1901*c* in the ith wiring layer, the two areas are connected by bridge wiring 1903 with metal wiring in the (i+2)th wiring layer, as shown in FIG. 14B. In the modified form, as shown in FIG. 14C, the (i+2)th wiring layer of an upper layer is used, but if two contiguous empty grids do not exist, the bridge wiring countermeasure can be taken and the whole layout does not largely get out of shape, thus the modified form provides a convenient countermeasure against an antenna rule error occurring in metal wiring in a lower layer.

As described above, according to the semiconductor device, the semiconductor device design method, the semiconductor device design method recording medium, and the semiconductor device design support system, antenna damage caused by an antenna effect occurring in a plasma step at the metal wiring formation time in a semiconductor process can be prevented. If antenna damage or an antenna rule error occurs, it can be handled at high speed and precisely by automatic processing of a CAD tool, etc. Further, countermeasures against antenna damage or an antenna rule error can be taken with upper layer metal wiring as much as possible by automatic processing of a CAD tool, etc. Resultantly, the antenna-damage or antenna rule error can be handled with small-scale change so that the operation timing on logical circuit design does not largely change before and after the countermeasures are taken.

What is claimed is:

1. A semiconductor device design method for forming a semiconductor device by combining and placing previously registered functional blocks, and determining a wiring pattern in accordance with given logical circuit specifications, and design method comprising:
    a registration step of previously registering a first functional block having a first conduction type diode comprising a first conduction type diffusion layer connected to an input pin of the functional block, and a second conduction type well connected to a second power supply or a second conduction type diode comprising a second conduction type diffusion layer connected to the input pin and a first conduction type well connected to a first power supply and a second functional block having the same logic as and the same drive capability as the first functional block but not containing the first or second conduction type diode;
    a determination step of determining whether or not a wiring conductor conducting to the input pin and a gate electrode becomes an antenna ratio exceeding an allowed antenna ratio in said semiconductor device; and
    a selection step of selectively using the first functional block, if said determination step determines that the input pin conducts to the gate electrode exceeding the antenna ratio.

2. A semiconductor device formed by combining and placing previously registered functional blocks, and determining a wiring pattern in accordance with given logical circuit specifications, said semiconductor device comprising:
    a first functional block including at least one of:
        a first conduction type diode having a first conduction type diffusion layer connected to an input pin of the first functional block and a second conduction type well connected to a second power supply, and
        a second conduction type diode having a second conduction type diffusion layer connected to the input pin and a first conduction type well connected to a first power supply; and
    a second functional block including the same logic as the first functional block but not containing said first or second conduction type diode,
    wherein either the first functional block or the second functional block is selectively used depending on whether or not a wiring conductor conducting to the input pin and a gate electrode becomes an antenna ratio exceeding an allowed antenna ratio in said semiconductor device.

3. A semiconductor device design method for forming a semiconductor device by combining and placing previously registered functional blocks, and determining a wiring pattern in accordance with given logical circuit specifications, and design method comprising:
    a registration step of previously registering a first functional block having a first conduction type diode comprising a first conduction type diffusion layer connected to an input pin of the functional block, and a second conduction type well connected to a second power supply or a second conduction type diode comprising a second conduction type diffusion layer connected to the input pin and a first conduction type well connected to a first power supply and a second functional block having the same logic as the first functional block but not containing the first or second conduction type diode;

a determination step of determining whether or not a wiring conductor conducting to the input pin and a gate electrode becomes an antenna ratio exceeding an allowed antenna ratio in said semiconductor device; and a selection step of selectively using the first functional block, if said determination step determines that the input pin conducts to the gate electrode exceeding the antenna ratio.

4. A computer-readable recording medium storing the semiconductor device design method as claimed in claim 3 as a program for causing a computer to execute the semiconductor device design method.

5. A semiconductor device design support system for automatically forming a semiconductor device by combining and placing previously registered functional blocks, and determining a wiring pattern in accordance with given logical circuit specifications, said design support system comprising:

registration means for previously registering a first functional block having a first conduction type diode comprising a first conduction type diffusion layer connected to an input pin of the functional block, and a second conduction type well connected to a second power supply or a second conduction type diode comprising a second conduction type diffusion layer connected to the input pin and a first conduction type well connected to a first power supply and a second functional block having the same logic as the first functional block but not containing the first or second conduction type diode;

determination means for determining whether or not a wiring conductor conducting to the input pin and a gate electrode becomes an antenna ratio exceeding an allowed antenna ratio in said semiconductor device; and selection means for selectively using the first functional block, if said determination step determines that the input pin conducts to the gate electrode exceeding the antenna ratio.

* * * * *